United States Patent
Capolino et al.

(10) Patent No.: US 11,921,136 B2
(45) Date of Patent: Mar. 5, 2024

(54) EXCEPTIONAL POINTS OF DEGENERACY IN LINEAR TIME PERIODIC SYSTEMS AND EXCEPTIONAL SENSITIVITY

(71) Applicant: THE REGENTS OF THE UNIVERSITY OF CALIFORNIA, Oakland, CA (US)

(72) Inventors: Filippo Capolino, Irvine, CA (US); Hamidreza Kazemi Varnamkhasti, Irvine (CA)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 82 days.

(21) Appl. No.: 17/408,071

(22) Filed: Aug. 20, 2021

(65) Prior Publication Data
US 2022/0057440 A1   Feb. 24, 2022

Related U.S. Application Data

(60) Provisional application No. 63/068,214, filed on Aug. 20, 2020.

(51) Int. Cl.
*G01R 23/02* (2006.01)
*H03B 5/08* (2006.01)

(52) U.S. Cl.
CPC .............. *G01R 23/02* (2013.01); *H03B 5/08* (2013.01); *H03B 2200/004* (2013.01)

(58) Field of Classification Search
CPC ........ G01R 23/00; G01R 23/02; G01R 23/06; G01R 23/07; G01R 23/08; G01R 23/16;
(Continued)

(56) References Cited

U.S. PATENT DOCUMENTS

| 3,517,342 A | 6/1970 | Orchard et al. |
| 3,713,050 A | 1/1973 | Golembeski |

(Continued)

FOREIGN PATENT DOCUMENTS

| DE | 2 229 494 A1 | 1/1974 |
| DE | 2 314 418 A1 | 10/1974 |

(Continued)

OTHER PUBLICATIONS

Figotin, A., "Synthesis of Lossless Electric Circuits Based on Prescribed Jordan Forms", 2020, retrieved from https://arxiv.org/pdf/2007.02143.pdf, pp. 1-42.

(Continued)

*Primary Examiner* — Son T Le
*Assistant Examiner* — Matthew W. Baca
(74) *Attorney, Agent, or Firm* — ONE LLP

(57) ABSTRACT

Disclosed herein is an exceptional points of degeneracy (EPD) system with a resonator by introducing a linear time-periodic variation. In contrast, prior art systems with EPD require two coupled resonators with precise values of gain and loss and a precise symmetry of inductances and capacitances. The disclosed EPD system only requires the tuning of the modulation frequency or modulation depth, which can be easily achieved in electronic systems. The EPD is a point in a system parameters' space at which two or more eigenstates coalesce, and this leads to unique properties not occurring at other non-degenerate operating points. Also disclosed are experimental data showing the existence of a second order EPD in a time-varying single resonator and the expected sensitivity of its resonances to circuit perturbations. The disclosed EPD system exhibits structural degenerate and non-degenerate resonances whose dynamics dramatically boosts its sensitivity performance to very small perturbations. The unique sensitivity induced by (Continued)

an EPD can be employed to create exceptionally-sensitive sensors based on a resonator by simply applying time modulation.

21 Claims, 21 Drawing Sheets

(58) Field of Classification Search
CPC .............. G01R 29/08; G01R 29/0864; G01R 29/0892; H03B 5/00; H03B 5/08; H03B 2200/004; G01H 13/00; H03J 3/00; H03J 3/02; H03J 3/04; H03J 3/06; H03J 3/08; H03J 3/10; H03J 3/16; H03J 3/18; H03J 3/20; H03J 3/22; H03J 3/24; H03J 3/30; H03J 3/32

See application file for complete search history.

(56) References Cited

U.S. PATENT DOCUMENTS

| | | | | |
|---|---|---|---|---|
| 4,381,489 | A | | 4/1983 | Canning et al. |
| 4,706,045 | A | * | 11/1987 | Ouyang .............. H03B 5/1228 331/117 FE |
| 5,930,123 | A | * | 7/1999 | Kammiller ........ H02M 3/33576 363/20 |
| 8,164,319 | B2 | * | 4/2012 | Bodano ................ H02M 3/156 323/284 |
| 10,178,735 | B1 | | 1/2019 | Jankovic et al. |
| 10,415,970 | B2 | | 9/2019 | Khajavikhan et al. |
| 2003/0048144 | A1 | * | 3/2003 | Keller ................... H03J 3/185 331/177 V |
| 2007/0085617 | A1 | * | 4/2007 | Salerno .................... H03F 1/42 331/167 |
| 2008/0150550 | A1 | * | 6/2008 | Vos ......................... G06F 3/046 324/655 |
| 2010/0315170 | A1 | * | 12/2010 | Locascio .................. H03L 7/00 331/1 R |
| 2011/0103098 | A1 | * | 5/2011 | Wu ........................ H02M 1/36 363/17 |
| 2018/0003749 | A1 | * | 1/2018 | Dogiamis ................ G01D 5/00 |
| 2018/0261977 | A1 | | 9/2018 | Feng et al. |
| 2020/0012008 | A1 | | 1/2020 | Chen et al. |

FOREIGN PATENT DOCUMENTS

| | | |
|---|---|---|
| WO | WO 2018/213410 A1 | 11/2018 |
| WO | WO 2019/232133 A1 | 12/2019 |

OTHER PUBLICATIONS

Kazemi, H., et al., "Ultra-Sensitive Radio Frequency Biosensor at an Exceptional Point of Degeneracy induced by time modulation", 2019, retrieved from https://arxiv.org/pdf/1909.03344.pdf, pp. 1-9.

Kazemi, H., et al., "Experimental Demonstration of Exceptional Points of Degeneracy in Linear Time Periodic Systems and Exceptional Sensitivity", 2019, retrieved from https://arxiv.org/pdf/1908.08516.pdf, pp. 1-12.

Kazemi, H., et al., "Exceptional Points of Degeneracy Induced by Linear Time-Periodic Variation", Physical Review Applied, 2019, vol. 11, pp. 014007-1-014007-10.

Wiersig, J., "Sensors operating at exceptional points: General theory", Physical Review A, 2016, vol. 93, pp. 033809-1-033809-9.

Chen, P.Y., et al., "Generalized parity-time symmetry condition for enhanced sensor telemetry", 2018, retrieved from https://arxiv.org/ftp/arxiv/papers/1812/1812.08296.pdf, pp. 1-45.

Sakhdari, M., et al., "Ultrasensitive, Parity-Time-Symmetric Wireless Reactive and Resistive Sensors", IEEE Sensors Journal, 2018, vol. 18, No. 23, pp. 9548-9555.

Schindler, J., et al., "Experimental Study of Active LRC Circuits with PT Symmetries", 2011, retrieved from https://arxiv.org/pdf/1109.2913.pdf, pp. 1-4.

Stehmann, T., et al., "Observation of Exceptional Points in Electronic Circuits", 2003, retrieved from https://arxiv.org/pdf/quant-ph/0312182.pdf, pp. 1-4.

Wiersig, J., "Enhancing the Sensitivity of Frequency and Energy Splitting Detection by Using Exceptional Points: Application to Microcavity Sensors for Single-Particle Detection", Phys. Rev. Lett., 2014, vol. 112, No. 20, pp. 203901-1-203901-5.

WO, PCT/US21/59365 ISR and Written Opinion, dated Feb. 9, 2022.

\* cited by examiner

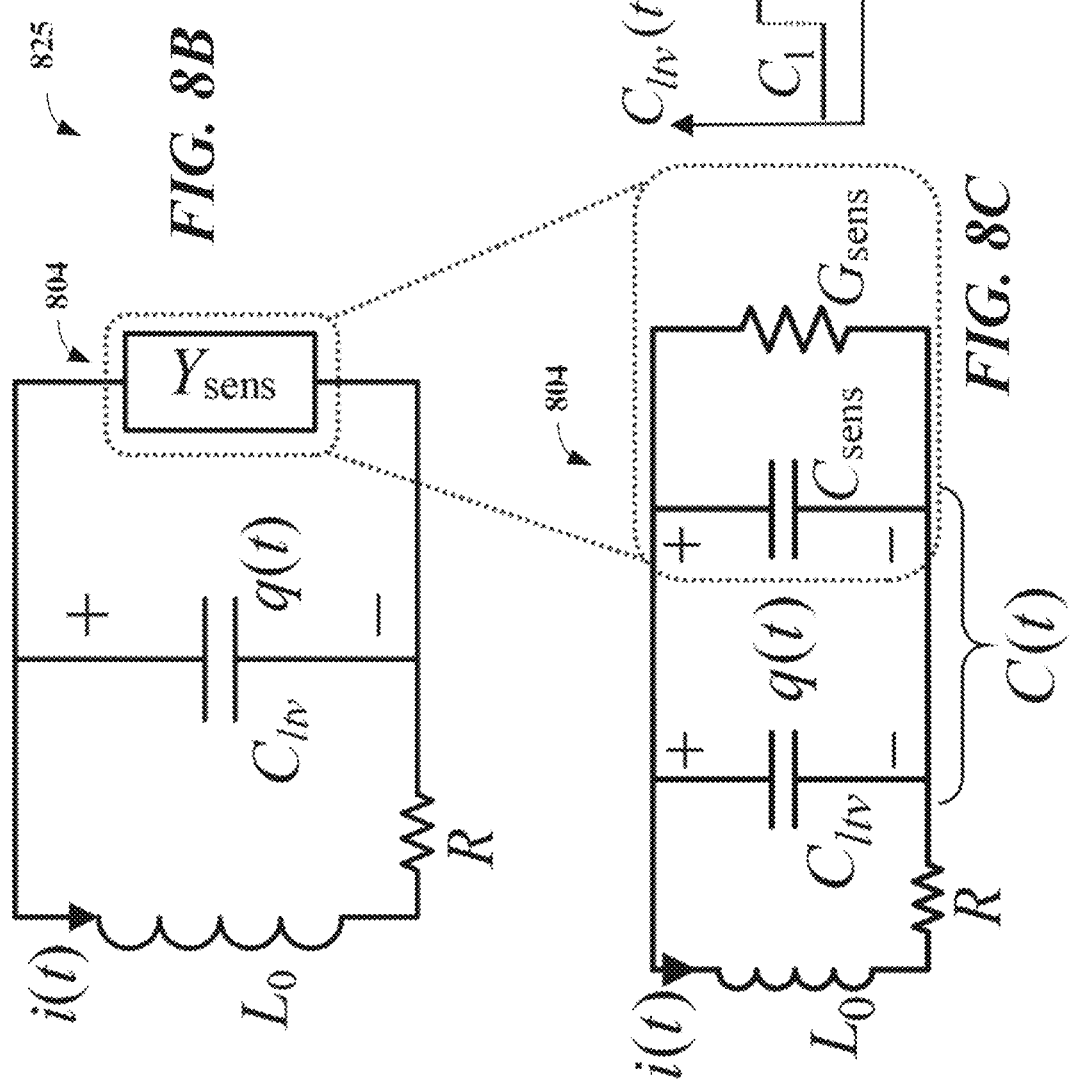

EXCEPTIONAL POINTS OF DEGENERACY IN LINEAR TIME PERIODIC SYSTEMS AND EXCEPTIONAL SENSITIVITY

CROSS-REFERENCE TO RELATED APPLICATIONS

The present application claims priority to U.S. Provisional Application No. 63/068,214, filed Aug. 20, 2020, which is incorporated by reference herein in its entirety for all purposes.

FIELD

The disclosure relates generally to the field of electronics, specifically and not by way of limitation, some embodiments are related to methods and systems for sensor, resonators, or both.

BACKGROUND

Sensing and data acquisition is an essential part of many medical, industrial, and automotive applications that require sensing of local physical, biological, or chemical quantities. For instance, pressure sensors, temperature sensors, humidity sensors, chemical sensors, and biosensors on the skin or inside the body have gained a lot of interest in the recent years. Thus, various low-profile low cost highly sensitive electromagnetic (EM) sensing systems are desirable to achieve continuous and precise measurement for the mentioned various applications. The operating nature of the currently used EM resonant sensing systems are mostly based on the change in the equivalent resistance or/and capacitance of the EM sensor by a small quantity $\delta$ (e.g., 1%), resulting in changes of measurable quantities such as the resonance frequency or the quality factor that vary proportionally to $\delta$ (that is still in the order of 1%). Additionally, current systems with exceptional point of degeneracy (EPD) require two coupled resonators with stringent requirements for precise gain and loss control, and inductance and capacitance symmetries in the two resonators (like for example in system that satisfy Parity-Time symmetry and derivatives). This makes current systems either less sensitive or expensive, more complicated to realize and hence less desirable.

SUMMARY

Disclosed are example embodiments of methods and systems for ultra-sensitive sensor based on applying time variation to one of its circuit components. One of the systems includes a circuit comprising: an LC resonator; and a modulation circuit configured to modulate the LC resonator to cause the LC resonator to operate at an EPD. The modulation circuit can be a time-varying voltage source configured to modulate the LC resonator to realize an EPD condition, or a state substantially close to EPD that preserves most of the EPD features related to high sensitivity.

The modulation circuit can be configured to modulate a capacitor of the LC resonator. It can be configured to modulate the capacitor of the LC resonator between two or more capacitance levels, generated by a modulating waveform with a low voltage level and a high voltage level. The modulation circuit can be a time-varying voltage source. The circuit can also include a reset circuit configured to reset the LC resonator prior to the LC resonator being saturated.

In some embodiments, the modulation circuit can also modulate an inductance value of an inductor of the LC resonator. The modulation circuit can be a time-varying circuit having a voltage or current pump and a multiplier.

In another disclosed circuit. The circuit includes an LC tank; a voltage multiplier coupled to a capacitor of the LC tank; a time-varying voltage source coupled to input of the voltage multiplier; and a reset circuit coupled to the LC tank. An additional capacitor can be added to act as the sensing capacitor.

One of the methods for detecting small perturbation includes: setting an initial voltage on a capacitor of a sensing circuit of a value of 10 nF for example; modulating the capacitance of the capacitor using a time-varying voltage source at one or more modulating frequencies; detecting a change in the free oscillation frequency of a voltage (or current) in the circuit when a perturbation of the capacitance occurs; and determining a change in perturbation based at least on the change in the free oscillation frequency.

The method further includes multiplying a voltage output from a voltage source, where the capacitor is modulated by the multiplied voltage output. The method further includes resetting the capacitor's voltage at each working cycle with an initial voltage of −50 mV.

In some embodiment, the capacitor is modulated between 5 to 15 nF, using a modulating waveform with a low voltage level and a high voltage level. Modulating the capacitance of the capacitor may be accomplished using a time-varying voltage source such that the capacitor has a capacitance value of 5 nF at a first voltage level and 15 nF at the second voltage level.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes and may not have been selected to delineate or circumscribe the disclosed subject matter.

BRIEF DESCRIPTION OF THE DRAWINGS

The present invention may be better understood by referring to the following figures. The components in the figures are not necessarily to scale. Emphasis instead being placed upon illustrating the principles of the disclosure. In the figures, reference numerals designate corresponding parts throughout the different views.

FIG. 8B illustrates an implementation of the proposed sensor in accordance with some embodiments of the present disclosure.

FIG. 8C illustrates a proposed LTP-LC resonator sensing circuit 850 in accordance with some embodiments of the present disclosure that illustrates that the sensing admittance Ysens can be composed of a sensing capacitor and a sensing conductance, as an example.

DETAILED DESCRIPTION

I. Introduction

Figure 1A:
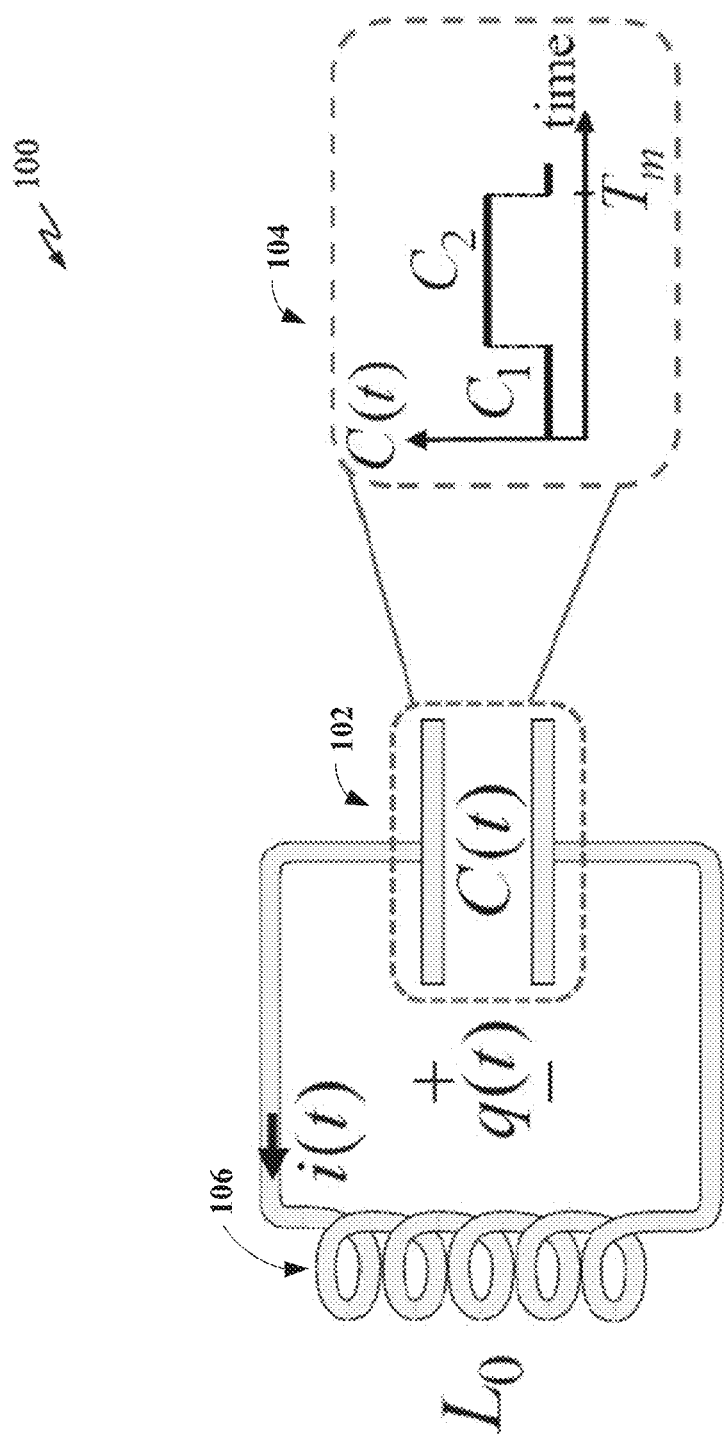
FIG. 1A illustrates a linear time-periodic LC resonator with a time-varying capacitor in accordance with some embodiments of the present disclosure.

Sensing and data acquisition is an essential part of many medical, industrial, and automotive applications that require sensing of local physical, biological or chemical quantities. For instance, pressure sensors, temperature sensors, humidity sensors, and chemical and biosensors have gained a lot of interest in the recent years. Thus, various low-profile low cost highly sensitive electromagnetic (EM) sensing systems are desirable to achieve continuous and precise measurement for the mentioned various applications.

In this disclosure, simple electronic circuits with enhanced sensitivity where a component of the circuit is varying with time are proposed. The proposed time varying electronic circuits are a new and simple way to obtain EPDs in electronic circuits by tuning the modulation frequency of the time modulated component. In general, the resonance frequency of a resonant circuit shifts due to any perturbation of a circuit parameter, therefore, changes in the circuit parameter can be detected looking at the resonance frequency shift. The amount of the frequency shift due to the perturbation is the sensitivity of such system. Indeed, it has been shown that an enhanced sensitivity to perturbations is achieved when the resonant circuit is operating in close proximity of an EPD. This enhanced sensitivity can be useful for numerous applications in sensing technology and high tunability of electronic devices.

An exceptional point of degeneracy (EPD) represents the coalescing (degenerate) point of the system's resonance frequencies. An EPD can emerge in a system when two or more eigenmodes of the system coalesce into a single degenerate eigenmode in both their eigenvalues and eigenvectors.

The simplest version of the proposed circuits with enhanced sensitivity based on EPDs is composed of a capacitor and an inductor where one of the components is time-modulated, e.g., its value changes periodically with time. The proposed circuits exhibit EPDs of order two in a single time-modulated resonator. In such a system the frequency at which the EPD occurs can be designed by a properly adjusting the values of inductor, capacitor, modulation frequency and modulation depth. These circuits may be one of the simplest physical systems with EPD and it is proposed the use of such system as a highly sensitive sensor.

One simple and easy way to implement the proposed linear-time varying (LTV) circuit is to employ a voltage multiplier as discussed below. Although other time-varying schemes could be implemented as well. In this disclosure, the terms LTV and LTP refer to the same physical concept, i.e., they are interchangeable. What makes the proposed circuits special and important in the class of sensors based on EPDs are their simplicity and tunability which implies relative ease of fabrication and low cost. Furthermore, the circuit may be less sensitive to tolerances in choosing the components than other circuits to operate at an EPD because the circuit may just need to tune the modulation frequency to find an EPD.

The proposed circuits can be utilized within different sensor schemes as the electronic part to boost the sensitivity of a component (typically, a capacitor) that is attached/immersed/in contact to the substance to be monitored. The proposed circuits are working from a few kilohertz to a few gigahertz; however, the basic idea can be generalized to higher frequencies assuming a system that provides a decent quality factor, either by choosing high quality factor passive components or by using active components to compensate for losses. Similar idea can be implemented at optical frequencies using other schemes to apply time modulation, like using nonlinearities in materials.

Additionally, this disclosure shows, experimentally, a new strategy for sensing that leads to a major sensitivity enhancement based on a physics concept rather than just an optimization method, which forms a new paradigm in sensing technology. In order to enhance the sensitivity of an electromagnetic/circuit system, the concept of EPD at which the observables are no longer linearly proportional to a system perturbation but rather have an $m^{th}$ root dependence with m being the order of the EPD is exploited. Such dependence enhances the sensitivity greatly for small perturbations. For instance, by exploiting an EPD of order 2, when the system capacitance is changed by a small quantity $\delta$ (e.g., 1%), then a resonance frequency of a resonator operating at an EPD would change by a quantity proportional to the square root of $\delta$ (e.g., 10%). The disclosed system takes advantages of this proportionality to create a sensing system that is ultra-sensitive to small changes. An EPD of order two is simply the splitting point (or degenerate point) of two resonance frequencies and it emerges in systems when two or more eigenmodes coalesce into a single degenerate eigenmode, in both their eigenvalues and eigenvectors. The emergence of EPDs is associated with unique properties that promote several potential applications such as enhancing the gain of active systems, lowering the oscillation threshold or improving the performance of laser systems or circuit oscillators, and enhancing sensors' sensitivity. It is noted that realistic systems work at a point close, not at, the EPD where the peculiar properties of the EPD are retained, like the extreme sensitivity. Near the EPD the effect of a perturbation tends to be linear (not square root) but with a large proportionality coefficient. An operational point close to the EPD makes the sensitivity high to small perturbations.

It should be noted that an EPD order higher than 2 (e.g., 3, 4) can also be exploited to take advantage of the proportionality between the changes in capacitance and the resonance frequency.

EPDs emerge in electromagnetic systems using various methods such as, but not limited to: by introducing gain and loss in the system based on the concept of parity-time (PT) symmetry, or by introducing spatial periodicity in waveguides, or temporal periodicity in resonant systems.

In this disclosure, a new scheme to obtain EPDs based on time-periodic modulation of a system parameter is disclosed for ultra-sensitive sensing applications. The disclosure is organized as follows. First, the basic concept of EPDs induced in linear time varying (LTV), i.e., linear time periodic (LTP) systems is summarized. Next, the existence of the LTP-induced EPDs is shown with experiments-derived data. Finally, EPD systems with exceptionally high sensitivity that can be used for sensing are disclosed.

The disclosed EPD system uses a periodic time-varying mechanism to introduce time-periodicity to a single resonating system to generate EPDs. In contrast, conventional systems like parametric amplifiers use the time variation as a non-conservative process to inject energy to the system and hence amplify the signal (a process called amplification). Whereas the disclosed system is not an amplifier and uses a single resonator and vary one parameter, so the state transition matrix (not the system matrix) becomes similar to a matrix containing a non-trivial Jordan block, showing the degeneracy of its eigenvectors. When working in close proximity of the EPD, two eigenvectors are not fully coalesced, but they are almost parallel, still providing EPD related properties, like the high sensitivity to perturbations. Conceptually this is very important and is different from conventional parametric amplifier systems.

Conventional parametric systems have been used as amplifier in lumped and distributed systems. Here, the disclosed EPD system is a sensing system that exploits the parametric changes in a system with EPD by focusing on perturbing a degeneracy of two modes instead of amplification.

The disclosed LTV system uses a resonator with certain resonance frequencies, which can be perturbed by an external perturbation, for example the external perturbation changes the value of a capacitor part of the EPD system (in other configurations the perturbation could change the value of another resonator's component, e.g., an inductor). In the disclosed system, the system's status is periodically reset to an initial condition, e.g., an initial charge on the capacitor that starts the oscillation to prevent saturation at the EPD and away from the EPD. This is different from the working principles of an amplifier of conventional systems.

Several ways to implement the circuit and read the output signal are disclosed below. First, the resonance frequency and the corresponding frequency shift of the circuit's response is calculated using Fourier transform of the time domain signal triggered by the initial voltage at each working cycle.

Secondly, the resonance frequency shift of such circuits (due to a perturbation) can be read with high impedance probes connected to a spectrum analyzer or dedicated resonance frequency reading electronics when the circuit is started by an initial condition. An initial condition can be a charge deposited on a capacitor.

Third, the resonance frequencies can be also observed using the reflection coefficient concept. And finally, the circuit can be designed to be unstable and therefore it starts oscillating at a frequency close to or at the EPD one. When a perturbation is applied, the frequency of oscillations is greatly shifted, and such a shift can be read by standard electronics or equipment.

Dramatically enhanced capabilities of the circuits combined with expected low costs and wide range of applications can make them into valuable commercial products.

The advantages of a time-varying circuit with an EPD are (i) enhanced sensitivity compared to conventional sensors based on observing a frequency shift in conventional resonators not working at the EPD condition; (ii) simplicity of the design implying ease of fabrication and consequent low cost.

In some embodiments, the disclosed EPD system or resonator can operate in close proximity of the EPD point. The system can operate close to the EPD points such that high sensitivity can still be achieved when the eigenstates are close to each other before being perturbed. The closeness of a system to an EPD condition can be observed by calculating the angle between the two eigenvectors. The perturbation of the system moves the system further away from the EPD point and the analysis and detection would be as discussed herein.

II. Theoretical Formulation for an LTP System

FIG. 1A illustrates a linear time-periodic LC resonator 100 with a time-varying capacitor 102 in accordance with some embodiments of the present disclosure. The capacitor 102 with time-varying capacitance is a periodic piecewise constant function as shown in the subset 104. As illustrated, in one example, the capacitance may be $C_1$ or $C_2$, e.g., depending on the time. In other words, resonator 100 can include a linear time-periodic (LTP) LC resonator with a time-varying capacitor 102 and an inductor 106. Another capacitor dedicated for sensing can also be placed in parallel without altering the fundamental working principle. In other words, the capacitance in the LC resonator may have fixed and variable components. Thus, the capacitance in the LC resonator may be equal to $C_{fixed}+C_{variable}$ and the variable capacitance may be $C_1$ or $C_2$, e.g., depending on the time. Accordingly, the capacitance in the LC resonator may be equal to $C_{fixed}+(C_1$ or $C_2)$, e.g., with the variable capacitance being $C_1$ or $C_2$ depending on the time. In other examples, the inductance, $L_0$, may be variable, and the capacitance, C, may be fixed. In further examples, the inductance, $L_0$, and the capacitance, C, may each be variable. In some examples, the inductance, $L_0$, and/or the capacitance, C, may have a fixed component and a variable component.

Figure 1B:
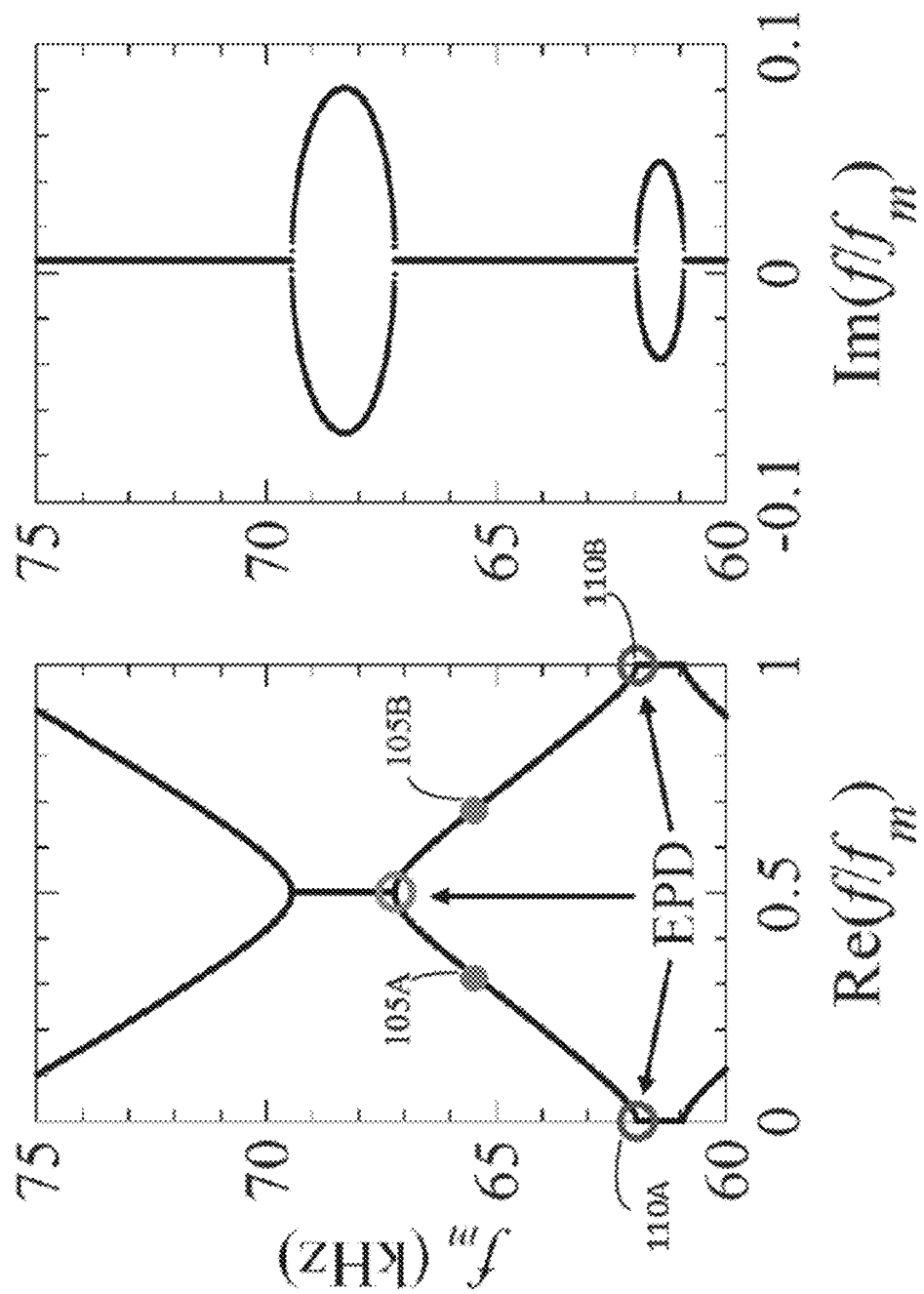
FIG. 1B is a dispersion diagram showing the real and imaginary parts of the eigen frequencies of the resonator versus modulation frequency $f_m$ of the capacitance and illustrates the EPD points in the diagram, encircled.

FIG. 1B is a dispersion diagram showing the real and imaginary parts of the eigen frequencies of the resonator (e.g., the circuit's resonance frequency) versus modulation frequency $f_m$ of the capacitance and illustrates the EPD points in the diagram, encircled. Due to time-periodicity, an EPD resonance at frequency $f_{e0}$ may also have Fourier harmonics $f_{e0}+sf_m$, with integer $s=0, \pm 1, \pm 2, \ldots$.

The single-resonator circuit (or linear time-periodic LC resonator) 100 may support an EPD 110 induced by the time-periodic variation. In some embodiments, resonator 100 can include a piecewise constant time-varying capacitance C(t) with period $T_m$. The piecewise modulation function is chosen to make the theoretical analysis easier. However, the presented analysis is valid for any periodic modulation function. As disclosed herein, the first practical implementation of the EPDs 110 induced in LTP systems is described.

The state vector $\Psi(t)$ describing the system in FIGS. 1A-1B is two-dimensional, e.g., $\Psi(t)=[[q(t), i(t)]^T$, where T denotes the transpose operator, q(t) and i(t) are the capacitor respectively. The temporal evolution of the state vector obeys the 2-dimensional first-order differential equation (eqn. 1, below)

$$\frac{d\Psi(t)}{dt} = \underline{M}(t)\Psi(t) \quad (1)$$

where M(t) is the 2×2 system matrix. The 2-dimensional state vector $\Psi(t)$ is derived at any time $t=nT_m+\chi$ with n being an integer and $0<\chi<T_m$ as (eqn. 2, below)

$$\Psi(t)=\underline{\Phi}(\chi,0)[\underline{\Phi}(T_m,0)]^n\Psi(0), \quad (2)$$

where $\underline{\Phi}(t_2, t_1)$ may be the 2×2 state transition matrix that translates the state vector from the time instant $t_1$ to $t_2$. The state transition matrix may be employed to represent the time evolution of the state vector; hence the eigenvalue problem may be formulated as (eqn. 3, below):

$$(\underline{\Phi}-\lambda I)\Psi(t)=0. \quad (3)$$

The eigenvalues are $\lambda_p=\exp(j\omega_p T_m)$, p=1, 2, where $\omega_p$ are the system angular resonant frequencies with all the system angular resonant frequencies' Fourier harmonics $\omega_p+s\omega_m$, where s is an integer and $\omega_m=2\pi/T_m$ is the modulation angular frequency. FIG. 1B shows the dispersion diagram of the resonant frequencies varying modulation frequency $f_m$. The two circles (105A and 105B) in FIG. 1B corresponds to two general distinct resonant frequencies at f and $f+f_m$, each with a positive real part. An EPD occurs when these two resonance frequencies coalesce at a given modulation frequency. At an EPD the transition matrix $\underline{\Phi}$ non-diagonalizable with a degenerate eigenvalue $\lambda_e$ (with corresponding eigen frequency $\omega_e$) because the two eigenvalues and two eigenvectors coalesce. Two possibilities may occur because of the nature of the problem (time periodicity, because there are only two possible eigenmodes, and neglecting losses for a moment): the degenerate eigenvalue is either i) $\lambda_e=1$, corresponding to an eigen frequency of $f_{e0}=f_m/2$ and its Fourier harmonics $f_{es}=f_{e0}+sf_m$ illustrated with the circles in FIG. 1B, or ii) $\lambda_e=1$, corresponding to $f_{e0}=0$ and its Fourier harmonics $f_{es}=f_{e0}+sf_m$ illustrated with a circle (110A and 110B) in FIG. 1B. Therefore, in general an EPD resonance may be characterized by the fundamental frequency $f_{e0}$ and all harmonics at $f_{es}=f_{e0}+sf_m$ where s=0, ±1, ±2, Moreover, at an EPD the state transition matrix $\underline{\Phi}$ is similar to a Jordan-Block matrix of second order, hence it has a single eigenvector, e.g., the geometrical multiplicity of the eigenvalue $\lambda_e$ is equal to 1 while its algebraic multiplicity is equal to 2. Considering the circuit parameters given in the next section including inductor small series resistance, an EPD in an example may occur at $f_m=62.7$ kHz, leading to a degenerate resonance frequency of $f_{e0}/f_m=j0.0041$ which corresponds to the circles 110A, 110B in FIG. 1B. Another EPD occurs at $f_m=67.7$ kHz, leading to a degenerate resonance frequency of $f_{e0}/f_m=0.5+j0.0038$ which corresponds to circle in FIG. 1B.

When $\lambda_e=1$ and hence $f_{e0}=f_m/2$, e.g., for EPDs at the center of Brillouin zone (BZ) (adopting the language used in space-periodic structures), the state transition matrix $\underline{\Phi}$ has a trace of 2, so that $[\underline{\Phi}(T_m, 0)]^n$ may be expressed as (eqn. 4, below)

$$[\underline{\Phi}(T_m,0)]^n=(-1)^{n+1}[n\underline{\Phi}(T_m,0)+(n+1)I], \quad (4)$$

where I is the 2×2 identity matrix. Thus, equation 2 may be reformulated using equation 4 as (eqn. 5, below)

$$\Psi(t)=(-1)^{n+1}[n\underline{\Phi}(T_m,0)+(n+1)I]\underline{\Phi}(\chi,0)\Psi(0). \quad (5)$$

Similarly, for EPDs at the edge of the BZ, e.g., when $\lambda_e=1$ and $f_{e0}=0$, the transition matrix $\underline{\Phi}$ has a trace equal to 2, and (eqn. 6, below)

$$[\underline{\Phi}(T_m,0)]^n=n\underline{\Phi}(T_m,0)-(n-1)I, \quad (6)$$

hence (eqn. 7, below)

$$\Psi(t)=[n\underline{\Phi}(T_m,0)-(n-1)I]\underline{\Phi}(\chi,0)\Psi(0). \quad (7)$$

Because of the multiplication of the time-period step n, it may be concluded from equations (5) and (7) that when the system is at the second order time-periodic induced EPD, the state vector grows linearly with time. This linear growth is expected, and the linear growth is one of the unique characteristics associated with EPDs. The algebraic growth may be analogous to the spatial growth of the state vector associated with the space periodic EPDs.

Figure 2:
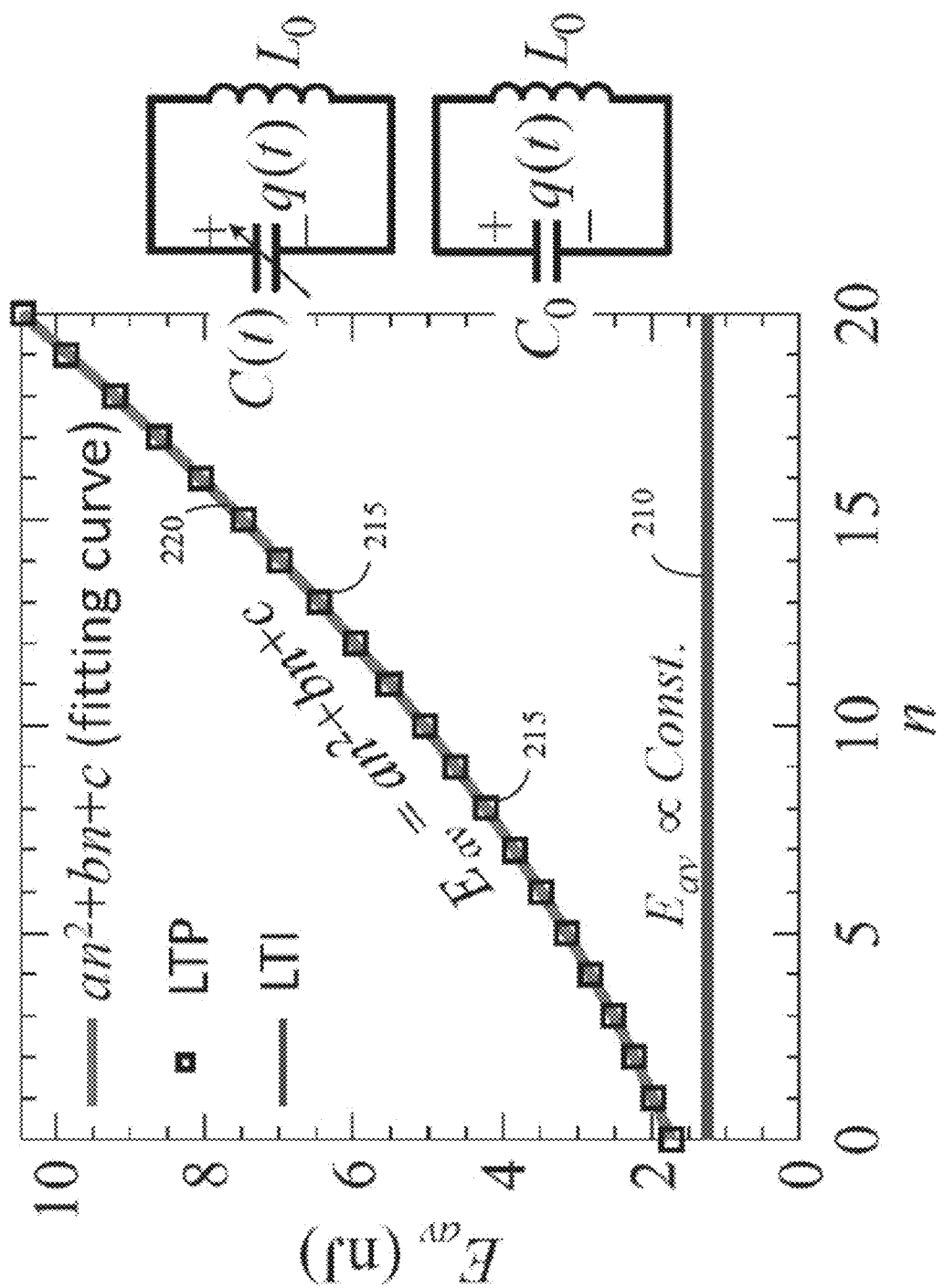
FIG. 2 is a chart showing a comparison between the time-average energy stored in a lossless, linear time-invariant (LTI) LC resonator and the time-average energy stored in a linear time-periodic (LTP) LC resonator operating at an EPD located at the edge of BZ where n is an integer representing the number of elapsed modulations periods. In the latter case, the time-average energy grows with time, fitted by a second order polynomial curve, revealing the occurrence of an EPD of order two.

FIG. 2 is a chart showing a comparison between the time-average energy stored in a lossless, linear time-invariant LC resonator (solid line 210) and the time-average energy stored in a linear time-periodic LC resonator operating at an EPD located at the edge of BZ (square symbols 215) where n is an integer representing the number of elapsed modulations periods. In the latter case the time-average energy grows with time, fitted by a second order polynomial curve (red solid line 220), revealing the occurrence of an EPD of order two. The fitting coefficients are set as a=0.01, b=0.23, and c=1.74.

The time-periodic LC tank considered in this section is not "isolated". In such a system, the time-varying capacitor is in continuous interaction with the source of the time variation that is exerting work. This interaction leads to a net energy transfer into or out of the LC tank; at some operating modulation frequencies the system simply loses energy to the time-variation source, while at other operating modulation frequencies the LC tank receives energy from the source of time variation. This behavior is in contrast to the behavior of a time-invariant lossless LC tank where the initial energy in the system is conserved and the net energy gain or loss is zero. The average transferred energy into or out of the time-periodic LC tank can be calculated using the time-domain solution of the two-dimensional first-order differential equation (7). FIG. 2 illustrates the calculated time-average energy transferred into a linear time-invariant (LTI) lossless LC tank (solid line 210) and into an LTP one operating at a second order EPD (black square symbols), where n=0 shows the average energy of the systems within the first period. The capacitor in both systems is initially charged with an initial voltage of $V_C(0^-)=-50$ mV.

In the LTP system the modulation frequency may be adjusted to $f_m=62.7$ kHz, so that the LTP system operates at the EPD denoted by the circles 110 in FIG. 1B. Note that the system is periodic, so that for an eigen-frequency $f_p$, there may also be all the Fourier harmonics with frequencies $f_p+sf_m$, where s may be an integer. In an example, the total energy in a lossless time-invariant LC resonator may be constant over time while the average energy in the time-periodic LC resonator may be growing at the EPD. This energy growth may be quadratic in time since the state vector (e.g., capacitor charge and inductor current) of a periodically time-variant LC resonator experiencing an EPD grows linearly with time, as shown in equation (5) and equation (7). Indeed, the solid curve in FIG. 2 illustrates a second order polynomial curve fitted to the LIT LC resonator energy where the fitting coefficients are given in the figure caption. One may note from the figure that the average energy of the LTI and LIT systems are not equal at n=0 which might seem counter intuitive. In fact, at n=0 it may be shown that the average energy of the systems within the first time-period may be higher for the LIT system due to the energy transfer within that first period.

III. Practical Implementation and Experimental Demonstration of High Sensitivity This section discusses verifying experimental properties inferred from the dispersion diagram illustrated in FIG. 1B.

Figure 3A:
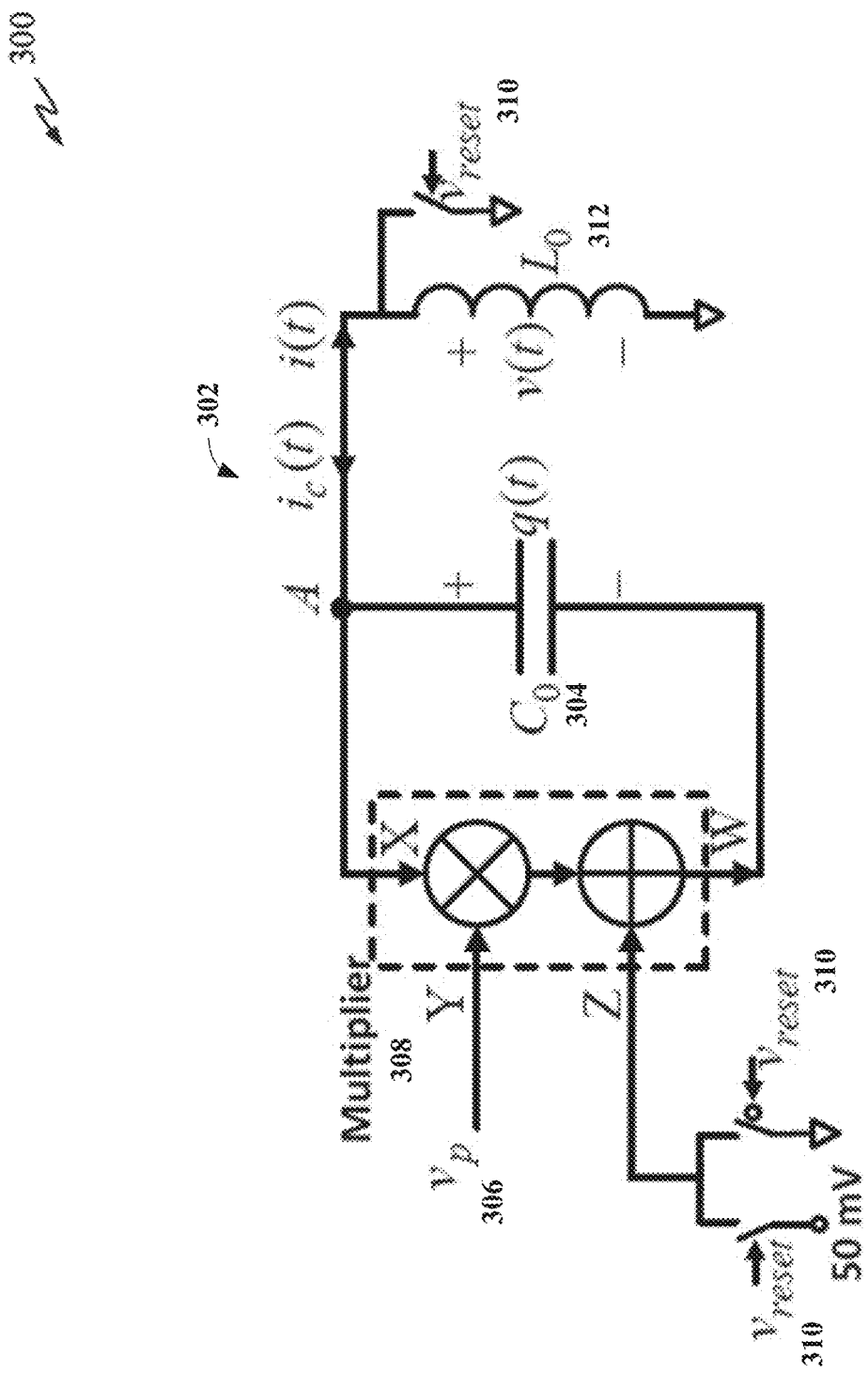
FIG. 3A is a circuit diagram illustrating a time varying LC tank with a time-periodic capacitor implemented based on the scheme illustrated based on a pump voltage and voltage multiplier.

In one example, the time varying LC tank 302 with the time-periodic capacitor 304 may be implemented based on the scheme illustrated in FIG. 3A, which is a schematic of the LTP-varying LC resonator 300 using the periodic pump voltage $v_p(t)$ 306 and a multiplier 308. The reset switches 310 may be used in the implementation to avoid saturation and to add the initial voltage at the beginning of each "run" time.

Figure 3C:
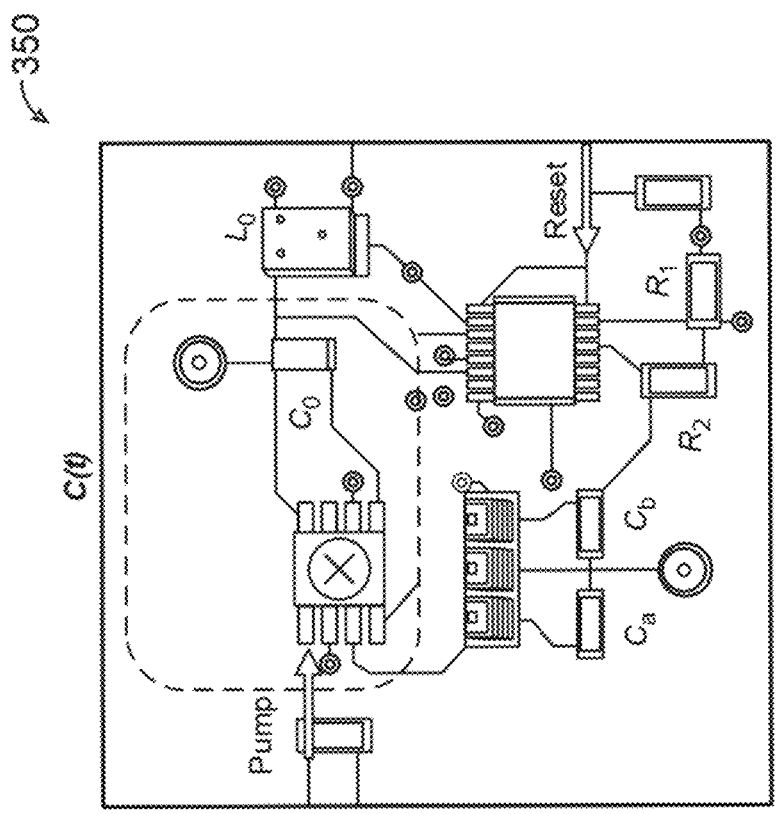
FIG. 3C is a circuit layout where the dashed square shows the synthetic time-varying capacitor using the pump voltage and a multiplier.
Figure 3B:
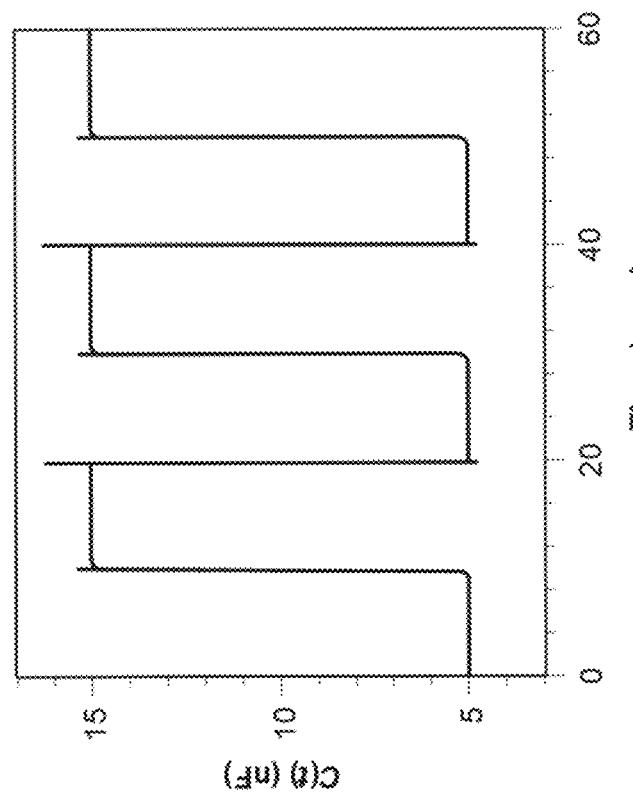
FIG. 3B is a chart illustrating time domain simulations of the time-varying synthetic capacitance with period $T_m$ seen from Node A in FIG. 3A.

FIG. 3B is a chart illustrating time domain simulations of the time-varying synthetic capacitance with period $T_m$ seen from Node A. FIG. 3C is a circuit layout 350 where the dashed square shows the synthetic time-varying capacitor using the pump voltage and a multiplier. The multiplier modulates the capacitance when the pump voltage is applied. On the lower right of the FIG. 3C there is the switching circuitry that resets the system and pre-charges the capacitance $C_0$ with initial charge when the reset signal is toggled ON. The circuit also includes the inductor $L_0$, the reset circuit with switches, the regulating capacitors $C_a$ and $C_b$, and the circuitry to produce the initial voltage (see also sections IV-VII below).

In the example of FIG. 3, the time variation may be carried out using a time-varying pump voltage $v_p(t)$ 306 and a multiplier 308. Hence the voltage applied to the capacitor $C_0$ 304 may be equal to $v_c(t)=v(t)[1-v_p(t)/V_0]$, where the term $V_0$ may be a constant coefficient of the multiplier that may be used to normalize the capacitor's output voltage. Here an LC resonator with a time varying capacitor C(t) 304 seen by the current $i_c(t)$ exiting the inductor 312 and by the voltage v(t) at Node A, hence satisfying the two equations $q(t)=C(t)v(t)$ and $di_c/dt=v(t)/L_0=q(t)/(L_0C(t))$. This leads to the definition of the time varying capacitance $C(t)\triangleq C_0(1-v_p(t)/V_0)$ and to a LTP LC circuit described by Eq. (1) (see also section IV-VII), which in turns leads to the time domain dynamics exhibiting EPDs.

In such a LTP LC circuit, the time variation behavior of the capacitance may be dictated by the variation of the pump voltage $v_p(t)$ 306. Therefore, to design the time-varying capacitance illustrated in FIG. 1A, a two-level piecewise constant pump voltage to the multiplier may be applied. The values of $C_1$ and $C_2$ may be adjusted by properly choosing the voltages of the piece-wise constant pump $v_p(t)$ 306 as further discussed in the section IV-VII below. In one example embodiment, designing a time-varying capacitor C(t) with the values of $C_1=5$ nF and $C_2=15$ nF may be the aim. Hence, the parameters of the circuit are set as $C_0=10$ nF, the two levels of the piecewise constant time varying pump voltage as $v_p/V_0=0.5$, and the period of the pump voltage as $T_m=20$ μs with 50% duty cycle. The operation of the scheme may be verified using the finite difference time domain (FDTD) simulation implemented in, for example, a Keysight ADS, or other test equipment, where a constant capacitor $C_0$ may be connected to a voltage multiplier. The time-varying capacitance, calculated as the ratio of the current passing through the capacitor $C_0$ to the time-derivative of the voltage at Node A, e.g., $i_c(t)/[dv/dt]$, is illustrated in FIG. 3B. It is worth mentioning that in such a scheme, the high level of the pump voltage $v_p$ controls the value of the capacitance $C_1$ and the low level controls the value of the capacitance $C_2$.

In the example circuit 350 of FIG. 3C, a four-quadrant voltage output analog multiplier, a high stability and precision ceramic capacitor $C_0=10$ nF, and an inductor $L_0=33$ μH with low DC resistance $R_{DC}=108$ mΩ, as specified in sections IV-VII may be used. It will be understood by those of ordinary skill in the art that in other examples, other values of $C_0$, $L_0$, and $R_{DC}$ may be used.

As illustrated in Sec. II, the capacitor voltage of the time-periodic LC tank may be expected to grow linearly in time when operating at an EPD; however, in practice it will saturate to the maximum output voltage of the multiplier. Therefore, to avoid voltage saturation, a reset mechanism to reset the resonator circuit may be implemented. In the illustrated example, the reset signal may be a digital clock with 20% duty cycle (e.g., $v_{reset}$=2 V for 20% of its period and $v_{reset}$=0 V otherwise) that allows the resonator circuit to run for the duration of the low voltage $v_{reset}$=0 V. During the reset time, the reset signal may be high, e.g., $v_{reset}$=2 V, and the resonator circuit may be at pause. At the end of this time interval the capacitor may be charged again with the initial voltage of $V_C(0^-)$=−50 mV for the start of the next working cycle as detailed in Sections IV-VII. In some example embodiments, the circuit may be provided with a 5 V DC voltage using, for example, a Keysight E3631A DC voltage supply (or other 5 V voltage supply). It should be noted that other types of voltage supply or other voltage outputs may also be used. In an example embodiment, two Keysight 33250A function generators or other function generators may be used, one to generate a two-level piecewise constant signal with levels of 0.525 V, duty cycle of 50% and variable modulation frequency $f_m$ as pump voltage $v_p(t)$ to generate the time-periodic capacitance C(t). The other function generator provides the resonator's reset signal, a two-level piecewise constant signal with levels of 2 V and 0 V, with duty cycle of 20% and a frequency of 1.1 kHz (much lower than $f_m$). In other examples, other function generators may be used.

A. Dispersion Diagram and Time Domain Response

Figure 4A:
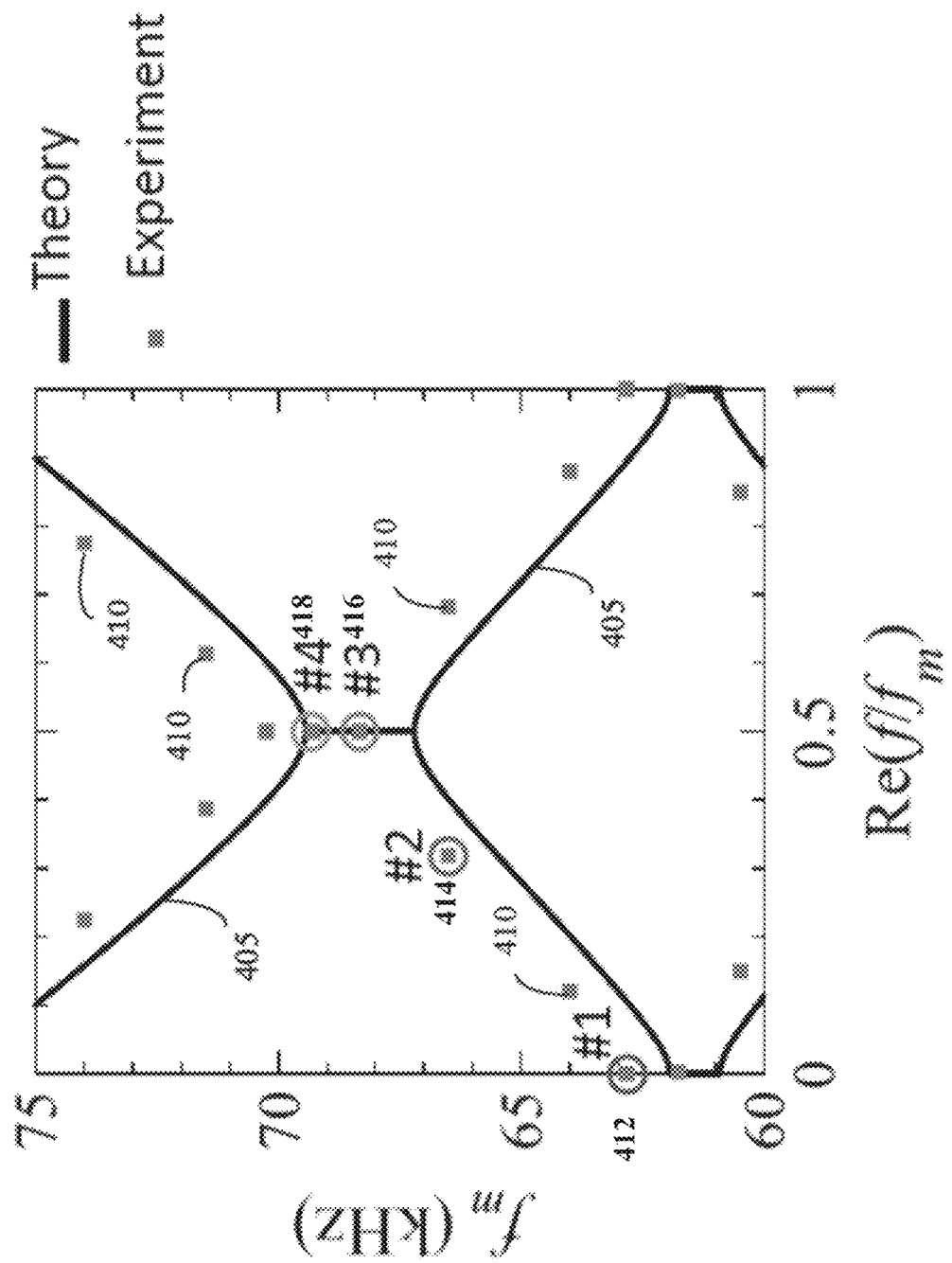
FIG. 4A presents the dispersion diagram as a function of the capacitance's modulation frequency $f_m$, which is experimentally varied by adjusting the frequency of the pump voltage $v_p(t)$.
Figures 4B, 4C:
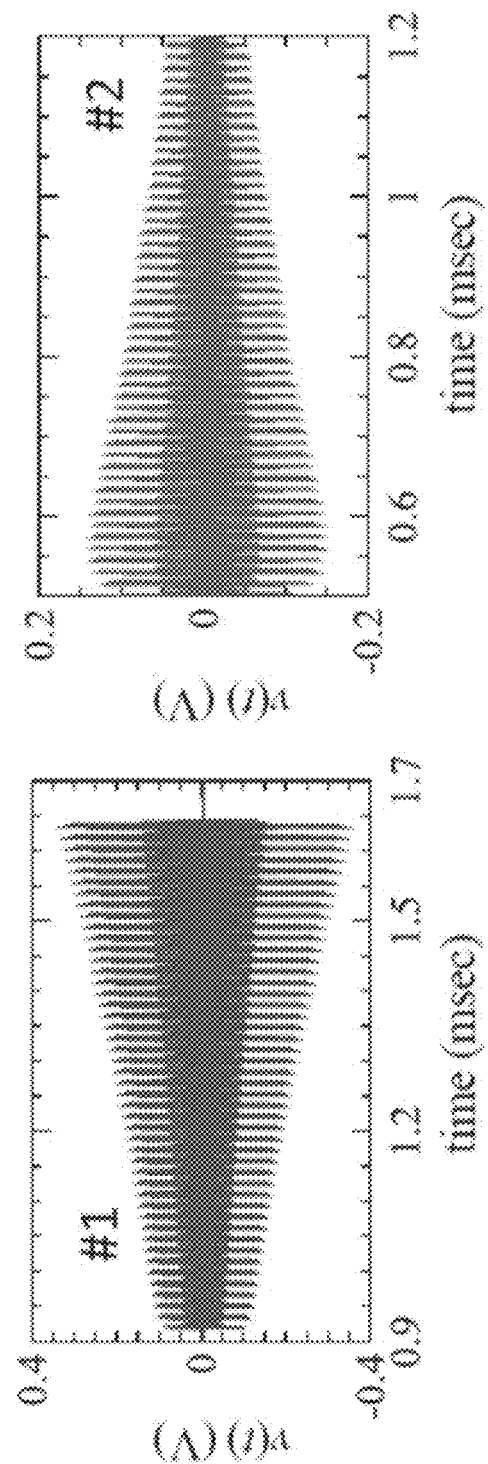
FIG. 4B illustrates the time domain voltage at the EPD denoted by the circle located at the edge of the BZ where the modulation frequency is $f_m=62.8$ kHz.
FIG. 4C shows the corresponding time domain signal at $f_m=66.5$ kHz which corresponds to two almost real resonance frequencies and their harmonics.

FIG. 4A presents the dispersion diagram as a function of the capacitance's modulation frequency $f_m$, which may be experimentally varied by adjusting the frequency of the pump voltage $v_p(t)$. In FIG. 4A, theoretical (solid lines 405) and experimental (square symbols 410) results for the complex dispersion diagram showing the circuit's resonance frequencies as a function of modulation frequency $f_m$. Time domain experimental results of the capacitor voltage at various modulation frequencies may be denoted by #1-4 in the dispersion diagram. FIG. 4B illustrates exceptional point #1 denoted by the circle 412 located at the edge of the BZ where the modulation frequency is $f_m$=62.8 kHz, for example.

The solid curve 405 denotes the theoretical dispersion diagram whereas square symbols 410 represent the experimental results. The experimental results may be obtained by calculating the resonance frequency of the circuit's response for different modulation frequencies using Fourier transform of the time domain signal triggered by the initial voltage $V_C(0^-)$ at each working cycle, where a Keysight DSO7104A digital oscilloscope or other test equipment including other digital oscilloscopes or other analog oscilloscopes may be used to capture the time domain output signal. A good agreement may be observed between the theoretical and experimental results, however, there is a slight frequency shift between the theoretical and experimental dispersion diagrams which may be due to parasitic reactances, components' tolerances and non-idealities in the fabricated circuit. Note that FIG. 4A illustrates that the only solutions in the first Brillouin zone defined here as Re(f)∈(0, $f_m$). Indeed, since the system is time periodic, every mode may be composed of an infinite number of harmonics with frequencies f+s$f_m$, where s is an integer. One can observe from the dispersion diagram that the time-periodic LC resonator operates at three different regimes depending on the modulation frequency. The following describe the three possible regimes of operation.

Figures 4D, 4E:
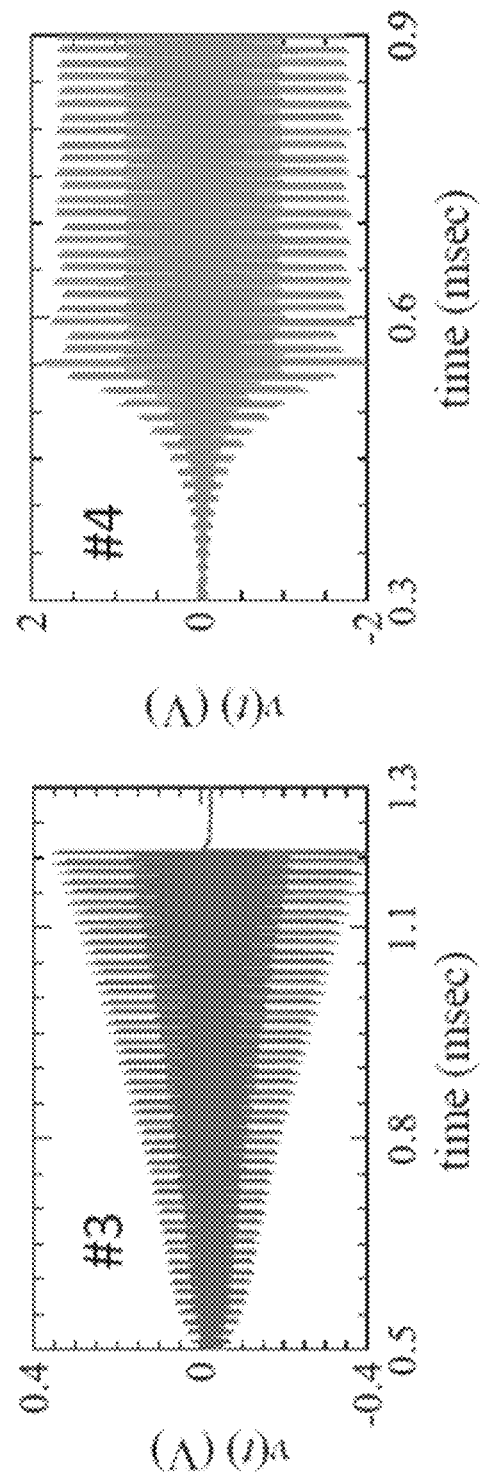
FIG. 4D shows the time domain voltage at the EPD, denoted by the circle, located at the center of the BZ where the modulation frequency is $f_m=68.3$ kHz.
FIG. 4E illustrates an unstable regime, representing two complex resonance frequencies, with opposite imaginary parts and real part equal to $f_m/2$, where the modulation frequency is set to $f_m=71.5$ kHz.

Real resonances: This is a regime where the system has two purely real oscillating frequencies (though in practice there is a small imaginary part due to the finite quality factor of the components). Point #2 414 with the circle in FIG. 4A illustrates a mode part of this regime, with real resonance frequencies f, and all its harmonics f+s$f_m$, where s is an integer. The signal has also the resonance frequency at f+$f_m$, and hence also the harmonics at f+s$f_m$. This means that two resonance modes with frequencies f and f+$f_m$ are allowed. FIG. 4C shows the corresponding time domain signal at $f_m$=66.5 kHz which corresponds to two almost real resonance frequencies and their harmonics. As mentioned, the observed small exponential decay of the response may be due to the finite quality factor of the components. In an ideal lossless system, frequencies may be purely real. FIG. 4C shows real-frequency resonance indicated by #2, denoted by the lines, where the modulation frequency $f_m$=66.5 kHz. FIG. 4D shows exceptional point #3, denoted by the circle, located at the center of the BZ where the modulation frequency is $f_m$=68.3 kHz.

Unstable condition: This is a regime where the system has two complex resonance frequencies with imaginary parts of opposite signs (point #4 418 with the circle in FIG. 4A. According to the time convention $e^{j\omega t}$, the state vector of the system corresponding to a complex resonance frequency with an imaginary part of negative sign shows an exponential growth, while the state vector corresponding to the resonance with an imaginary part with positive sign exhibits an exponential decay, hence it shows an unstable system. The exponentially growing behavior would be the dominant one and it is the one seen in the time domain response in FIG. 4E that would eventually saturate if a reset circuit was not included.

FIG. 4E illustrates an unstable regime, point #4, denoted by orange lines, represents two complex resonance frequencies, with opposite imaginary parts and real part equal to $f_m$/2, where the modulation frequency is set to $f_m$=71.5 kHz. Note that due to time-periodicity, time domain signals have all Fourier harmonics f+s$f_m$, with s=0, ±1, ±2 . . . . In this case the modulation frequency of the pump voltage is set to $f_m$=71.5 kHz. iii) Exceptional points of degeneracy: An EPD is the point that separates the two previous regimes, where two frequency branches of the dispersion diagram (describing two independent resonance solutions) coalesce. Indeed, at the EPD the two resonant modes of the system coalesce and as discussed in the previous section, the state vector shows a linear growth with time, yet the resonance frequencies are real (when neglecting the small positive imaginary part of the resonance frequency due to finite quality factor of the components). From the theoretical analysis and from the experimental results in FIG. 4A one may note two types of EPDs exist in a linear time-periodic system. EPDs that exist at the center of the BZ, e.g., at $f_{e0}$=0.5$f_m$, with Fourier harmonics located at $f_{es}$=(0.5+s) $f_m$, where the integer s denotes the harmonic number. An example of such a type of EPDs is observed at $f_m$=68.3 kHz and is denoted by point #3 with the circle 416 in FIG. 4A. The measured time domain behavior of the circuit at this modulation frequency is illustrated in FIG. 4D where the linear growth of the capacitor voltage may be seen. It grows until it reaches saturation or till the system is reset as described in the previous section. The other type of EPDs are those that exist at the edge of the BZ, e.g., at $f_{e0}$=0, with Fourier harmonics located at $f_{es}$=s$f_m$. An example of this type of EPDs is denoted by point #1 with the circle 412 at $f_m$=62.8 kHz in FIG. 4A. The measured time domain behavior of the circuit at such an EPD is depicted in FIG. 4B. Note that the oscillation of the time domain signal for an EPD at the edge of the BZ is due to the harmonics located at $sf_m$.

One may observe that a standard "critically damped" LTI RLC circuit with two coinciding resonance frequencies is also an exceptional point, however, that point is characterized by two resonance frequencies with vanishing real part; hence, it is a different condition from what is described in this disclosure.

B. Sensitivity to Perturbations

Sensitivity of a system's observable to a specific parameter is a measure of how strongly a perturbation to that parameter changes the observable quantity of that system. The sensitivity of a system operating at an EPD is boosted due to the degeneracy of the system eigenmodes. In the LTP system considered in this paper, a perturbation $\delta$ to a system parameter leads to a perturbed state transition matrix $\underline{\Phi}$ and thus to perturbed eigenvalues $\lambda_p(\delta)$ with p=1, 2. Therefore, the two degenerate resonance frequencies occurring at the EPD change significantly due to a small perturbation $\delta$, resulting in two distinct resonance frequencies $f_p(\delta)$, with p=1, 2, close to the EPD resonance frequency. The two perturbed eigen values near an EPD are represented using a convergent Puiseux series (also called fractional expansion series) where the Puiseux series coefficients are calculated using the explicit recursive formulas. A first-order approximation of $\lambda_p(\delta)$ is (eqn. 8, below)

$$\lambda_p(\delta) \approx \lambda_e + (-1)^p \alpha_1 \sqrt{\delta}, \quad (8)$$

and the perturbed complex resonance frequencies is approximately calculated as (eqn. 9, below)

$$f_p(\delta) \approx f_{es} \pm j\frac{f_m}{2\pi}(-1)^p \alpha_1 \sqrt{\delta}, \quad (9)$$

where $$\alpha_1 = \sqrt{-\frac{d}{d\delta}[\det[\Phi(\delta) - \lambda \underline{I}]]}\bigg|_{\delta=0, \lambda=\lambda_e}$$

and the ± signs correspond to the cases with EPD at the center or edge of the BZ, respectively. Equation (9) is only valid for very small perturbations $\delta \ll 1$ and it is clear that for such a small perturbation the resonance frequencies $f_p$ change dramatically from the degenerate resonance $f_{es}$ due to the square root function. In other words, the EPD is responsible for the square root dependence $\Delta f = f_p(\delta) - f_{es} \propto \sqrt{\delta}$. Now, let us assume that the perturbation $\delta$ is applied to the value $C_1$ of the time-varying capacitor, and the perturbed $C_1$ is expressed as $(1+\delta)C_1$. Considering an unperturbed LTP LC resonator as illustrated in the subset of FIG. 1A, the system has a measured EPD resonance at a modulation frequency $f_m=62.8$ kHz for the parameter values given in section III. This EPD resonance frequency is at $f_{e0}=0$ Hz, corresponding to point #1 (circle 412) in the dispersion diagram illustrated in FIG. 4A, and at all its Fourier harmonics $f_{es}=f_{e0}+sf_m$.

By looking at the spectrum of the measured capacitor voltage it may be observed that among the various harmonics of such EPD resonance, the frequency of $\text{Re}(f_{e6}) = 6f_m = 374.2$ kHz has a dominant energy component, hence it is the one discussed in the following. The theoretical and experimental variations in the real part of the two perturbed resonance frequencies due to a perturbation $\delta \ll 1$ in the time-variant LC circuit are illustrated in FIG. 5.

Figure 5:
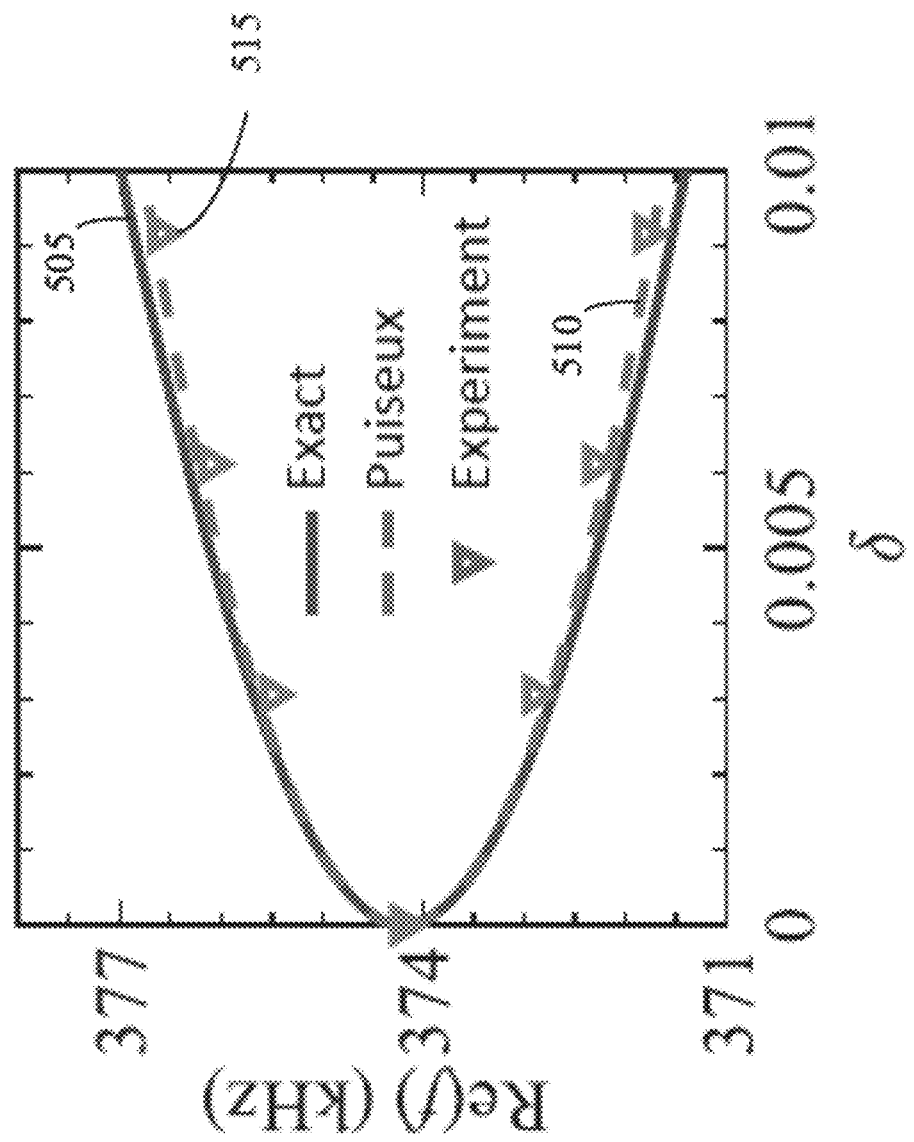
FIG. 5 illustrates proof of exceptional sensitivity, i.e., a large frequency shift for very small perturbation of the capacitor.

FIG. 5 illustrates proof of exceptional sensitivity, i.e., a large frequency shift for very small perturbation of the capacitor. The experimental result is in good agreement with the theoretical approximation ("Puiseux") and numerical ("Exact") predictions. Experimental and theoretical changes in the real part of the two resonance frequency $f_p$ due to a positive perturbation $\delta$ applied to the capacitance $C_1$ of the time-varying capacitor. The two real frequencies greatly depart from the EPD frequency around 374 kHz even for very small variation of the capacitance following the fractional power expansion $\Delta f = f_p(\delta) - f_{es} \propto \sqrt{\delta}$. The solid line 505, dashed line 510 and triangular symbols 515 represent the calculated-exact, Puiseux series approximation, and experimental resonance frequencies of the LTP LC circuit illustrated in the FIG. 1A. The EPD frequency around 374 kHz corresponds to point #1 (circle 412) at the edge of the BZ in FIG. 4A.

Only the results for positive variations of $\delta$ are shown here, hence the resonances move in the directions where they are purely real (though the presence of small losses would provide a small imaginary part in the resonance frequency). The solid line 505, dashed line 510, and triangular symbols 515 denote the calculated-exact (solutions of Eq. (3) explained in Sec. II), Puiseux series approximation, and the experimentally observed resonance frequencies, respectively when varying $\delta$. The coefficient $\alpha_1$ in the Puiseux series is calculated to be $\alpha_1 = j2.65$ which according to the fractional expansion in Eq. (9) it implies only change of the real part of the resonance frequency for a positive perturbation $\delta > 0$ while the imaginary part is constant. The three curves are in excellent agreement for small perturbations, showing also the remarkable agreement of the experimental results with the theoretical ones indicating that this is a viable practical solution to make ultra-sensitive sensors.

The perturbation $\delta$ (the relative change in capacitance $C_1$) is experimentally introduced through changing the positive voltage level of the pump voltage $v_p(t)$. In such a design, each 5 mV change in the positive level of the pump voltage will result in 1% change of the $C_1$ capacitor value corresponding to $\delta=0.01$ (see the section IV-VII). The experimental results in this figure are extracted using the Fourier transform of the time domain signal, leading to the resonance frequencies composing the signal. The results in FIG. 5 demonstrate theoretically and experimentally that for a small perturbation $\delta$, the real part of the resonance frequency is significantly changed. Therefore, these experimental results unequivocally demonstrate the exceptional sensitivity of the proposed system operating at an EPD which can be used to conceive a new class of extremely sensitive sensors.

As described and shown above, exceptional points of degeneracy (EPDs) directly induced via time modulation of a component in a single resonator can be achieved. This is in contrast to EPDs realized in PT-symmetric systems that would require two coupled resonators instead of one, and the precise knowledge of gain and loss in the system. It is shown that controlling the modulation frequency of a component in a single resonator is a viable strategy to obtain EPDs since varying frequency in a precise manner is common practice in electronic systems. The occurrence of a second order EPD has been shown theoretically and experimentally in two ways: by reconstructing the dispersion diagram of the system resonance frequencies, and by observing the linear growth of the capacitor voltage. How a temporally induced EPD renders a simple LC resonating system exceptionally sensitive to perturbations of the system capacitance has also been experimentally demonstrated. The excellent agreement between measured and theoretical sensitivity results demonstrate that the new scheme proposed in this paper is a viable solution for enhancing sensitivity, paving the way to a new class of ultra-sensitive sensors that can be applied to a large variety of problems where the occurrence of small quantity of substances shall be detected.

IV. Time Varying Capacitance and Fundamental Dynamic Equations

Time-varying capacitance may be defined based on the multiplier concept in FIG. 3A above and show that its definition leads to an LC circuit described by differential equations consistent to the previous theory, hence leading to the occurrence of exceptional points of degeneracy (EPDs). The physical implementation of the electronic linear time periodic (LIT) LC resonator with a time varying capacitor and reset signal has been discussed.

The LIT LC resonator circuit illustrated in FIG. 3C is composed of two subsystems: i) the sensing device which may comprise a time variant LC resonator operating at the time induced EPD; and ii) a reset mechanism to stop the growing oscillation amplitude and to set the initial voltage of the capacitor at the beginning of each operation regime to avoid saturating the circuit. The schematic and detailed working principle of each sub-system is explained in the following sections.

The time varying capacitance may be obtained in one example by resorting to the multiplier scheme in FIG. 3A. Without worrying for a moment about the physical implementation and the reset scheme that are explained in the following sections, the voltage $W(t)$ may be observed to be given by the product $W(t)=v(t)v_p(t)/V_0$, where the term $V_0$ is a constant coefficient of the multiplier that may be used to normalize the multiplier's output voltage. Because, in an example, the signal $v_p(t)$ is a square wave with frequency $f_m$, it experiences jumps (discontinuities), implying that also $W(t)$ may be discontinuous. The voltage applied to the capacitor $C_0$ may be given by $v_c(t)=v(t)-W(t)=v(t)(1-v_p(t)/V_0)$. This capacitor voltage cannot be discontinuous in time, hence $v_c(t)$ is a continuous function and indeed $v(t)$ carries the same discontinuities as $W(t)$.

We define the capacitance of the synthesized time varying capacitor used in this paper as $C(t)=q(t)/v(t)$, where $q(t)$ is the charge on the capacitor. The same charge may also be given by $q(t)=C_0v_c(t)$, leading to the value of the time varying capacitance $C(t)=C_0v_c(t)/v(t)$. Substituting for $v_c(t)$ in this latter equation leads to $C(t)=C_0(1-v_p(t)/V_0)$ that is the synthesized piece wise time varying capacitance with period $T_m$.

The two fundamental differential equations describing the LTP LC circuit in FIG. 3A in the main text may be $dq/dt=i_c(t)=-i(t)$ and $di/dt=v(t)/L_0=q(t)/(L_0C(t))$, that in matrix form are rewritten as (eqn. 10, below)

$$\frac{d}{dt}\begin{pmatrix} q \\ i \end{pmatrix} = \begin{pmatrix} 0 & -1 \\ \frac{1}{L_0 C(t)} & 0 \end{pmatrix}\begin{pmatrix} q \\ i \end{pmatrix} \qquad (10)$$

This first order differential equation is the same as that considered in Eq. (1), therefore it leads to the same dynamic current and voltage of the LTP LC circuit, including the occurrence of EPDs.

V. Design and Implementation of the Time-Varying Capacitance

The scheme of the proposed sensor (e.g., the time varying LC resonator) is based on the design of a synthesized periodic time-varying capacitance $C(t)$ that switches between two values $C_1$ and $C_2$ with a modulation frequency $f_m$ where the parameters $C_1$, $C_2$ and $f_m$ need to be tunable. In order to make such a time-varying capacitor, a regular time-invariant capacitor $C_0$ which is connected in parallel with a multiplier $U_1$ may be used as illustrated in FIG. 6A.

Figure 6A:
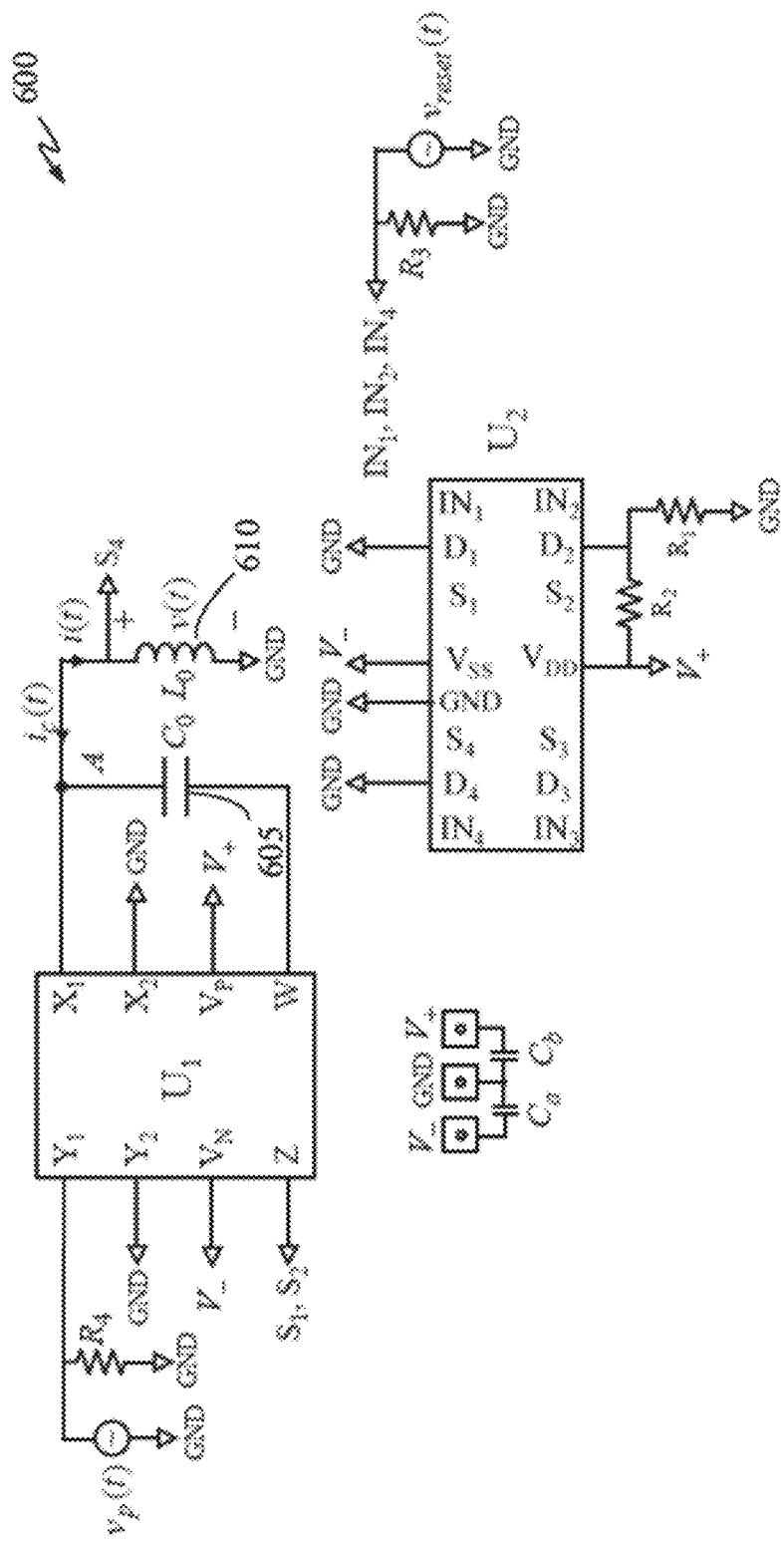
FIG. 6A illustrates a schematic of time varying resonator circuit, where a multiplier is used for modulating the capacitance value and a switching circuitry to reset the system in accordance with some embodiments of the disclosure.

FIG. 6A illustrates a schematic of the time-varying LC resonator circuit 600 in accordance with some embodiments of the disclosure. Resonator circuit 600 includes a capacitor 605 and an inductor 610. Capacitor 605 can have capacitive range from 5-20 nF. In some embodiments, capacitor 605 can have a capacitance of 10 nF (e.g., NP0 1206). Inductor 610 can have an inductive range from 20-50 µH. In some embodiments, inductor 610 can have an inductance of 33 µH. Resonator circuit 600 also includes multiplier $U_1$ and the reset mechanism circuit $U_2$ as illustrated in FIG. 6.

In general terms, the multiplier $U_1$ provides the time domain function (eqn. 11, below)

$$W(t) = \frac{(X_1 - X_2)(Y_1 - Y_2)}{V_0} + Z, \qquad (11)$$

that is connected to the lower terminal of the capacitor $C_0$. Here W, $X_1$, $X_2$, $Y_1$, $Y_2$, and Z represent the voltages at the pins denoted with the same symbols of the multiplier $U_1$ and $V_0=1.05$ V is the voltage normalization factor dictated by the multiplier and given in the data sheet. In this circuit schematic, the $X_2$ and $Y_2$ pins are both connected to the ground, the pump voltage $v_p(t)$ is applied to the $Y_1$ pin and the $X_1$ pin is connected to Node A as illustrated in FIG. 1A. Hence, the output function of the multiplier is simplified as (eqn. 12, below)

$$W(t) = \frac{X_1 v_p(t)}{V_0} + Z. \qquad (12)$$

From the schematic and since the $X_1$ pin input current is zero (it has high input impedance), the current flowing into the capacitor $C_0$ may be expressed as (eqn. 13, below)

$$i_c(t) = C_0 \frac{d}{dt}(X_1 - W). \qquad (13)$$

Figure 6B:
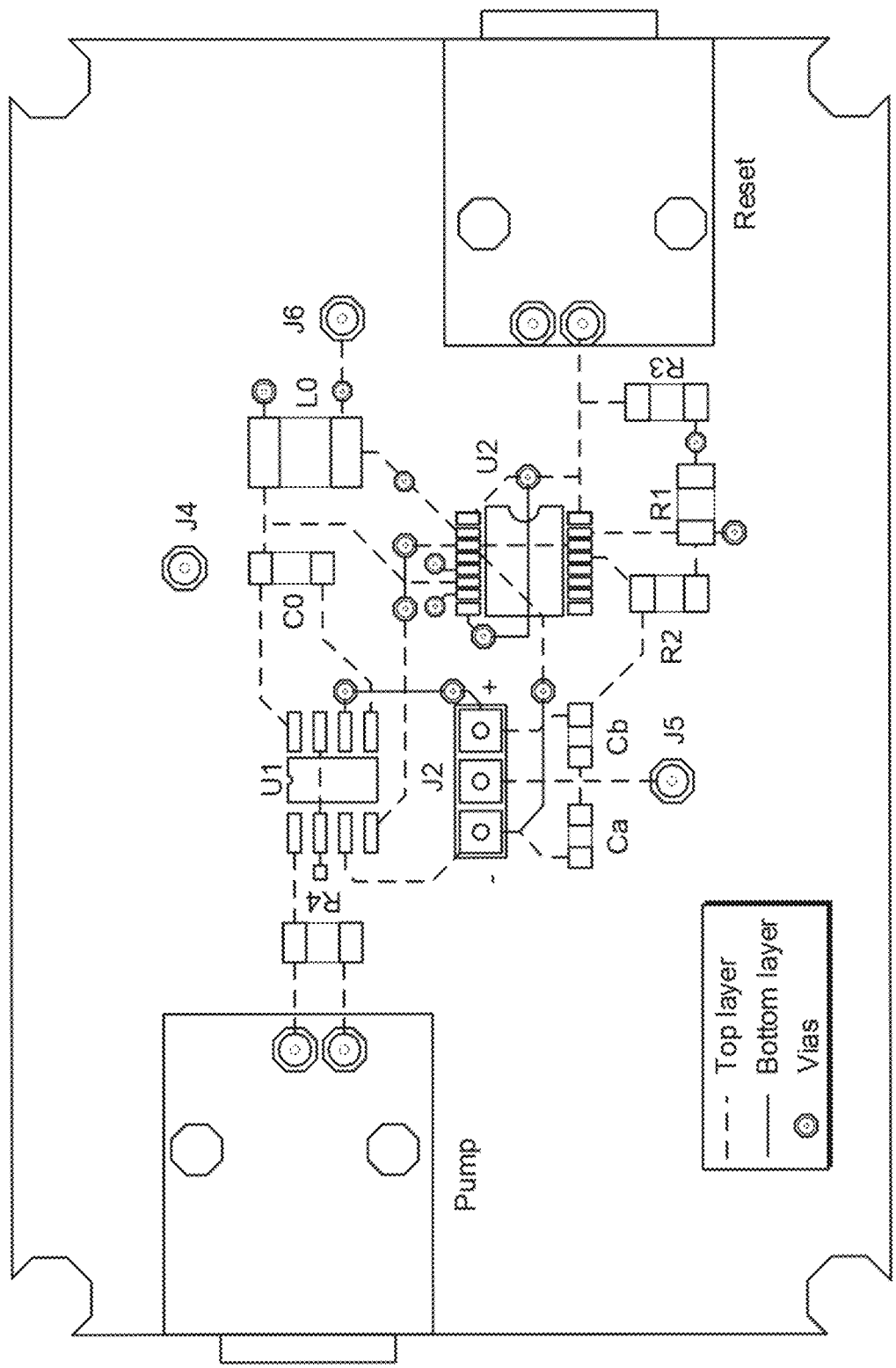
FIG. 6B is a diagram illustrating an example of printed circuit board (PCB) layout.
Figure 6C:
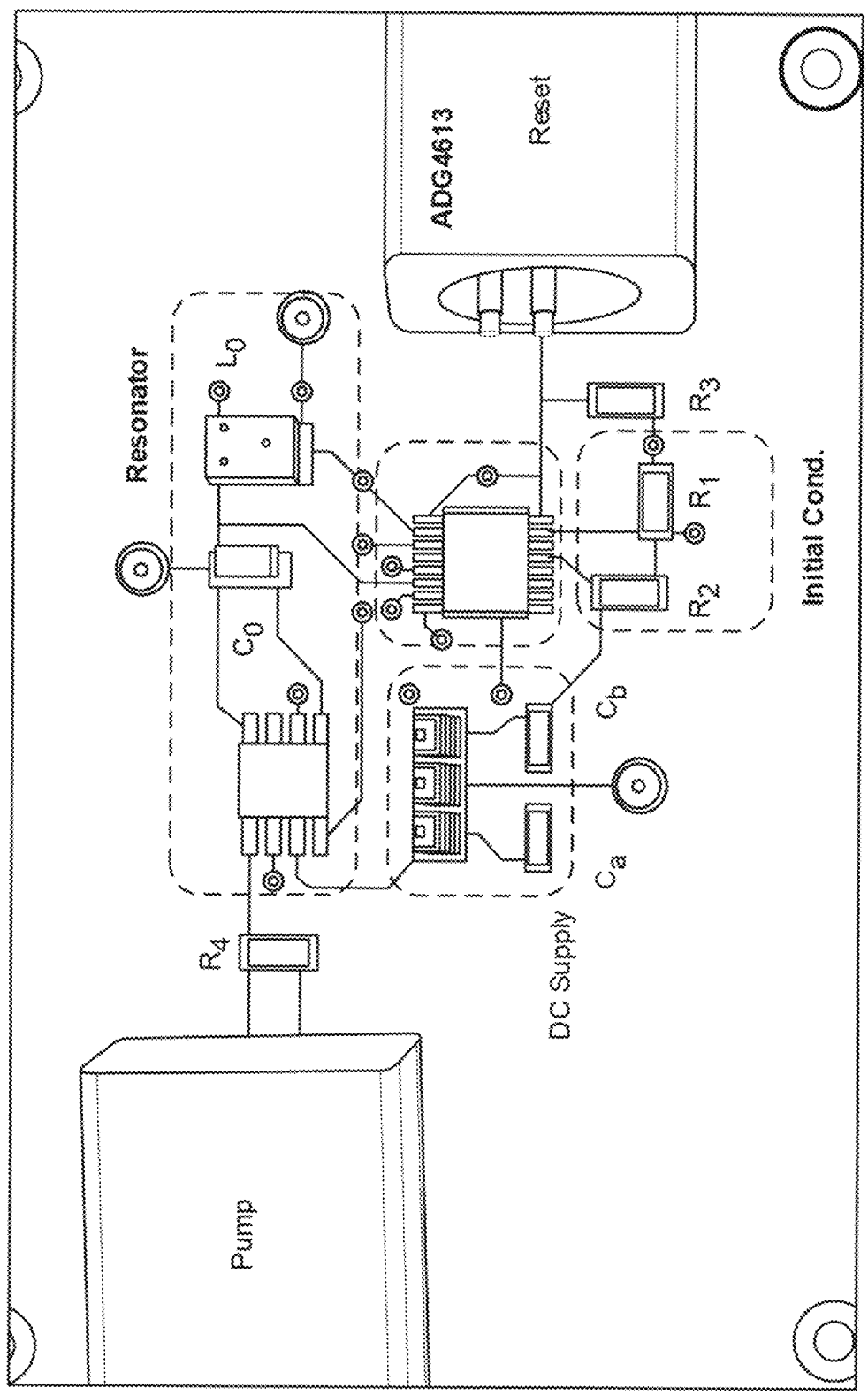
FIG. 6C is a diagram illustrating an example PCB layout of the assembled circuit.

The printed circuit board (PCB) layout and the actual assembled circuit with resonator (capacitor $C_0$, inductor $L_0$, multiplier chip $U_1$), chip with switches $U_2$, pump voltage $v_p(t)$ and reset $v_{reset}(t)$ connectors, and PCB traces are illustrated in FIG. 6B-C. In the following, the two operation regimes of the circuit and the principle of the reset mechanism are discussed in detail.

FIG. 6B illustrates an example PCB layout and FIG. 6C illustrates an example PCB layout of the assembled circuit including top layer traces, a ground plane, bottom traces, and connecting vias. In this design Via $J_4$ is a probe point for the capacitor voltage, whereas Vias $J_5$ and $J_6$ are test points connected to the ground plane and are used to connect the ground of the measurement equipment to the ground of the circuit. All the ground nodes are connected to each other using the bottom cyan layer.

VI. Regimes of Operation

The proposed circuit has two distinct phases (regimes) of operation which are differentiated based on the status of the reset signal $v_{reset}$. Reset signal $v_{reset}$ may be a digital clock coming from an external waveform generator that is used to stop the oscillation of the time-varying LC resonator when it is at a high-level voltage (e.g., a logic Level "1") and allow the resonator circuit to run when the resonator is at low level voltage (e.g., a logic Level "0"). The two different operation regimes are described below.

(i) LTP-LC operating regime with EP D: During this regime, the reset signal is a logic low (logic Level 0) so that the time varying LC resonator is allowed to have a free run, e.g., the LC resonator's voltage is varying as in a time varying LC resonator with a given initial voltage condition. During this regime, a low-level voltage on $v_{reset}$ causes Switch 1 to be "on", hence the pin Z of the multiplier $U_1$ illustrated in FIG. 6A, is connected to the ground (see section IV) while Switch 4 is off, therefore, the input $X_1 = v(t)$. In this case, by using equation (12) the multiplier output may be $W(t) = v(t)v_p(t)/V_0$. Therefore, the voltage difference at the two ends of the capacitor $C_0$ may be $v_c(t) = v(t) - v(t)v_p(t)/V_0$ and the current flowing into the capacitor may be (eqn. 14, below)

$$i_c(t) = C_0 \frac{d}{dt}\left(v(t) - v(t)v_p(t)/V_0\right), \quad (14)$$

which can be also interpreted as flowing into a synthesized time varying capacitor with applied voltage v(t). Considering a two-level piecewise constant pump voltage $v_p(t)$, where $dv_p(t)/dt = 0$ for $0 < t < 0.5\, T_m$ and $0.5\, T_m < t < T_m$, the current flowing into the capacitance is given by (eqn. 15, below)

$$i_c(t) = C(t)\frac{dv}{dt} = C_0\left(1 - v_p(t)/V_0\right)\frac{dv}{dt}. \quad (15)$$

It is clear from equation 14 that the capacitance seen from Node A towards the ground is time-variant and the shape of a capacitance curve may be dictated by the pump voltage. Considering the pump voltage as (eqn. 16, below)

$$v_p(t) = \begin{cases} 0.525\ V & 0 < t < 0.5 T_m \\ -0.525\ V & 0.5 T_m < t < T_m \end{cases} \quad (16)$$

and recalling that $V_0 = 1.05$ V, the time varying capacitance from equation (15) is (eqn. 17, below)

$$C(t) = \begin{cases} 0.5 C_0 & 0 < t < 0.5 T_m \\ 1.5 C_0 & 0.5 T_m < t < T_m \end{cases} \quad (17)$$

It may be observed from equations (15)-(17) that a change of 5 mV in the high level of the pump voltage $v_p(t)$ in an example may result in approximately a relative change of 1% in the capacitance value $C_1$, e.g., (eqn. 18, below)

$$\delta \triangleq \frac{C_{1,perturbed} - C_1}{C_1} = \frac{(1 - 0.520/1.05)C_0 - 0.5C_0}{0.5C_0} \approx 1\% \quad (18)$$

(ii) Reset regime: During this regime, the reset signal is a logic high (logic Level 1), therefore Switch 4 is "on" and $S_4$ takes the value of $D_4$ that is grounded. As a result, Node A is connected to the ground and the operation of the time-varying LC resonator is halted. Moreover, during this regime, the capacitor $C_0$ is charged again with an initial voltage to be ready for the next LTP-LC operating regime. The operation of the reset mechanism circuit is explained in the following section.

VII. Reset and LTP-LC Operating Regime Mechanisms

Figure 7:
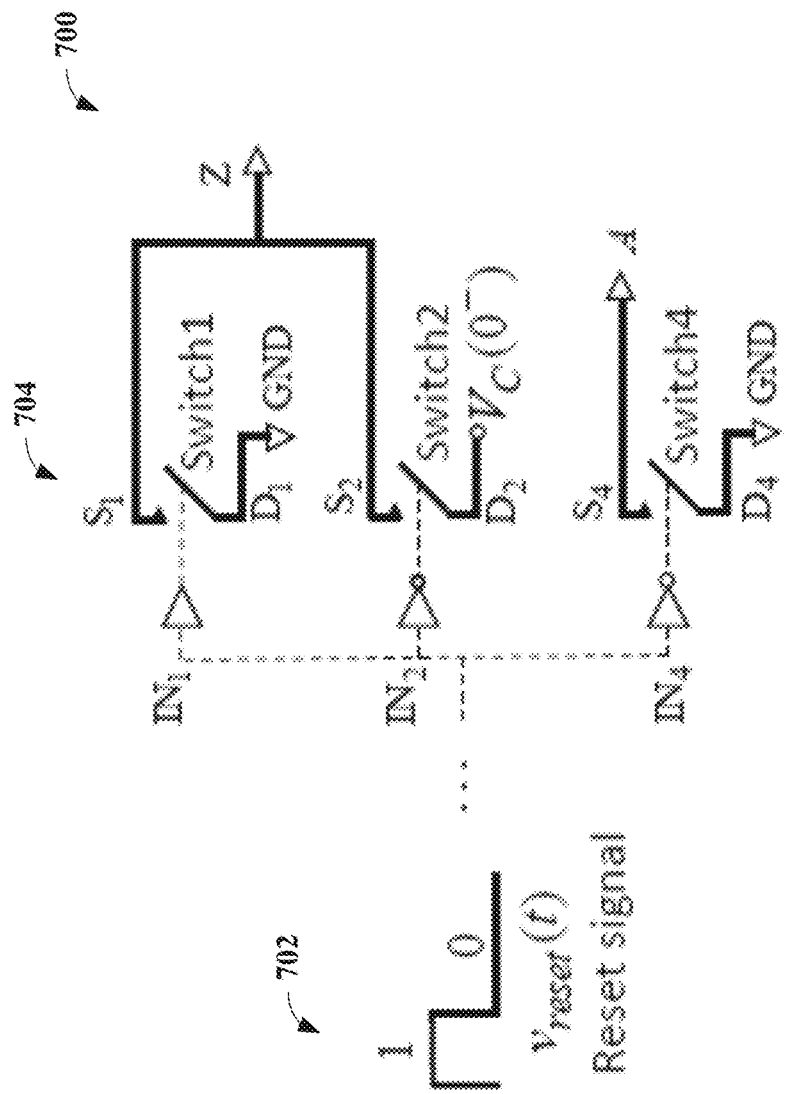
FIG. 7 is a diagram illustrating a reset signal and reset switches. The three switches are used for establishing the two regimes of operation in each cycle: the sensing regime at an EPD and the reset regime for stopping the resonance from reaching saturation and also charging again the capacitor $C_0$ with an initial voltage for the next cycle.

FIG. 7 is a diagram illustrating a reset mechanism 700 including reset signal 702 and reset switches 704. The three switches 704 may be used for establishing the two regimes of operation in each cycle: the sensing regime at an EPD and the reset regime for stopping the signal to grow excessively, hence the resonance from reaching saturation, and also charging again the capacitor $C_0$ with an initial voltage for the next cycle. The reset mechanism 700 in this circuit may be employed to (i) prevent the saturation of the system due to the growth of the capacitor voltage with time and to (ii) set an initial voltage on the capacitor $C_0$ in order to start a new LTP-LC operating regime. The reset mechanism 700 may be implemented using the ADG4613 chip which contains four independent single pole/single throw (SPST) switches. This figure shows the three switches where IN, D, and S represent the control input, input, and output of the switches, respectively. In the illustrated example, two switches (1 and 3) may be turned on with a logic Level 1 (high level voltage of $v_{reset}$) on the appropriate control input, implying that during that time $S_1$ and $S_3$ take the value of terminals $D_1 = 0V$ and $D_3 = 0V$, respectively, and they are open when they are "off". Switch 3 is not used in our physical implementation. The logic is inverted on the other two switches (switch 2 and switch 4), e.g., the switches turn on with logic Level 0 (low level voltage of $v_{reset}$) on their control input implying that during that time $S_2$ and $S_4$ take the value imposed at terminals $D_2 = V_+ R_1/(R_1+R_2)$, and $D_4 = 0$ V, respectively. The reset mechanism may use switched, e.g., Switches 1, 2, and 4 where the control input of these switches may be connected to a digital clock signal $v_{reset}$ as indicated in FIG. 6A. The reset signal is a digital clock with 20% duty cycle, e.g., $v_{reset} = 2$ V for 20% of its period (logic Level 1) and $v_{reset} = 0$ V otherwise (logic Level 0). Therefore, the LTP LC resonator is showing an oscillating output for 80% of the reset signal period. In summary, during the 80% of the $v_{reset}(t)$ period the circuit has $S_1 = 0$ V, while the $S_2$ and $S_4$ are open circuits, implying that $Z = 0$ V and $X_1 = v(t)$, whereas during the remaining 20% of the reset signal period, the circuit has $S_2 = V_+ R_1/(R_1+R_2)$ and $S_4 = 0$ V while $S_1$ is left open, implying that $Z = S_2$ and $X_1 = 0$ V.

A. Halting the Oscillation

As described, one of the benefits of the reset mechanism circuit is to stop the time-varying LC resonator operating at an EPD before it reaches saturation. For this purpose, during the reset regime, Switch 4 is used to short Node A to the ground when the reset signal $v_{reset}$ is at logic Level 1. Indeed, the reset signal logic Level 1 is connected to the input control $IN_4$ which turns on Switch 4 connecting $S_4$ to the ground. Since Node A is connected to $S_4$, the voltage across the inductor $L_0$ is set to zero preventing the oscillation.

B. Setting the Initial Voltage Condition on the Capacitor $C_0$

During each reset regime just described, Node A is grounded therefore the voltage oscillation is halted, and the inductor current decays with a short transient. In order to start a new LTP LC operating regime after each reset regime, it may be necessary to provide the capacitor with the initial voltage. In an example embodiment, this may be done by using Switch 2 of, e.g., the ADG4613 illustrated in FIGS. 6 and 7 with its control input $IN_2$ connected to $v_{reset}$. Since $S_2$ is connected to the Zpin, during this reset regime time $Z=V_+R_1/(R_1+R_2)$, and Z represents the summing input of the voltage multiplier as shown in Eq. (2). Furthermore, because Node A is grounded, $X_1=0$ V, resulting in $W=Z=V_+R_1/(R_1+R_2)$, e.g., the capacitor is inversely charged. An initial capacitor voltage $V_C(0^-)=-V_+R_1/(R_1+R_2)=50$ mV is produced by the voltage divider using $R_1=47\Omega$ and $R_2=4.7$ k$\Omega$ and by the positive DC supply $V_+=5$ V illustrated in the FIG. 6A.

VIII. General Sensing Application with Additional Sensing Capacitor

The proposed sensing circuit scheme can be applied to any system where an inductor or a capacitor is varied by a change of the sensed physical/biological/chemical quantity. For example, analytical biosensors play a tremendous role in modern medicine through enabling the monitoring of biomarkers in human health. The applications of these sensors are diverse as they form the core of many point-of-care, wearable, and diagnostic tools utilized in pathology, nutrition, fitness, biomedical science, and more. Traditionally, an analytical biosensor is composed of two main elements: a bioamplifier (such as a bioreceptor), and a transducer (converting the biological signal into an electrical one). Various number of modalities exist to monitor biomarkers including but not limited to electrochemical impedance spectroscopy, piezoelectric microcantilever surface plasmon resonance, immunoelectrophoresis, fluorescence, enzyme-linked immunosorbent assay. While many of these techniques have found roles in a variety of applications, a majority are encumbered by limitations in system size and weight, sample preparation requirements, power consumption, and limited capabilities in wireless operation. Dielectric-RF sensors (that sense the presence of analytes via permittivity shifts) possess traits that address many issues that have limited traditional biosensors; however, these sensors have limited use in modern devices. The reason for this is two-fold: these sensors possess low sensitivity (signal change due to input) and low selectivity (discrimination of an analyte from interferents). While there are potential strategies to improve RF-biosensor selectivity, a new electromagnetic amplification strategy may be examined to improve biosensor sensitivity. One of the most recent methods to dramatically enhance sensors sensitivity is to design the RF sensor to operate at what may be referred to as an exceptional point of degeneracy (EPD). The EPD represents the coalescing point of the degenerate resonance frequencies and it emerges in a system when two or more eigenmodes of the system coalesce into a single degenerate eigenmode in both their eigenvalues and eigenvectors. The system at an EPD shows an inherent ultra-sensitivity, especially for small perturbation, that can be exploited to enhance the sensitivity of the liquid-based radio frequency biosensor. In addition to high sensitivity, EPDs are associated with other unique properties such as enhancing the gain of active systems, lowering oscillation threshold, etc. Recently, EPD associated sensors based on the concept of parity-time (PT) symmetry in multiple, coupled resonators have been investigated. In this disclosure, instead, the concept of an EPD that occurs in a single resonator may be used. In an example embodiment, the single resonator is not based on PT-symmetry.

This new method may be used to generate a second order EPD induced by time-periodic variation of a system parameter aiming at improving the sensitivity of liquid based radio frequency biosensors, leading to an intrinsic ultra-sensitivity. The concept of an EPD in a single resonator obtained by simply applying a time domain modulation which was shown in and the experimental demonstration of the occurrence of such EPD has been previously shown. Some embodiments apply the EPD concept developed in these two papers to conceive a new class of biosensors.

Figure 8A:
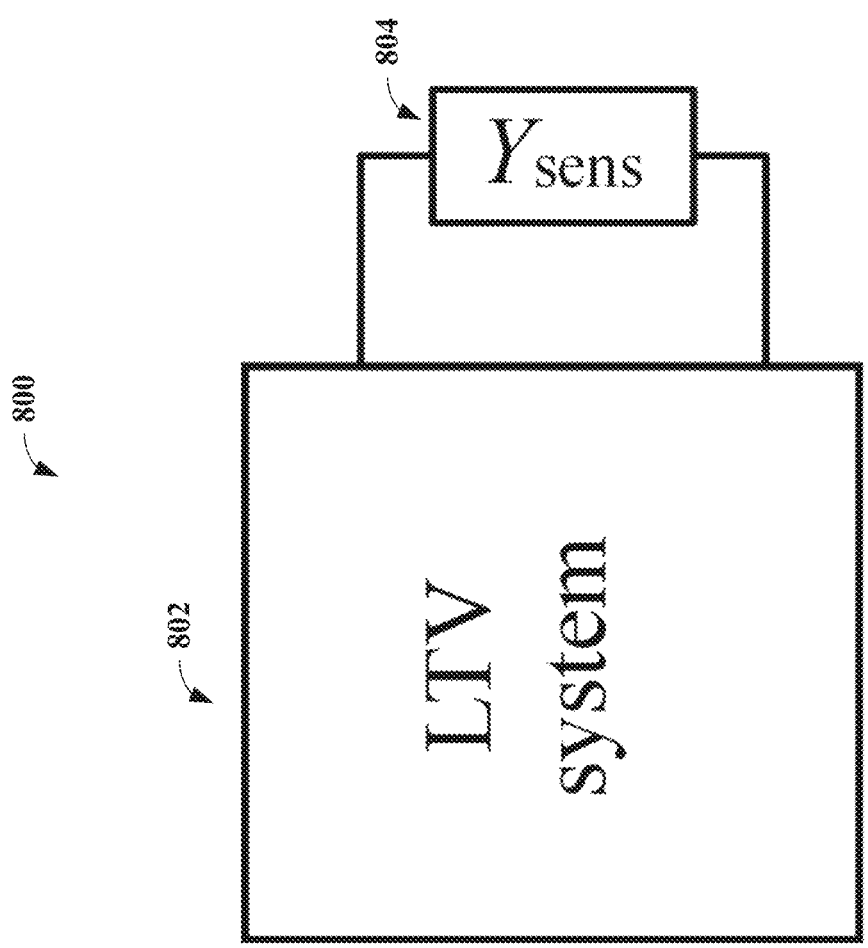
FIG. 8A is a general diagram illustrating the general idea of the sensor with a linear time varying (LTV) resonator system working at an EPD (or at its vicinity). Perturbing the sensing admittance perturbs the circuit away from the EPD (or from the vicinity of an EPD).

FIG. 8A is a general diagram illustrating an example 800 of the general idea of the sensor with a linear time varying (LTV) resonator system 802 and a sensor 804 working at an EPD (or at its vicinity). Perturbing the sensing admittance perturbs the circuit away from the EPD (or from the vicinity of an EPD). As discussed above, an LTV system 802 may use a resonator with certain resonance frequencies, which may be perturbed by an external perturbation, for example the external perturbation changes the value of a capacitor part of the EPD system. The LTV system 802 may be connected to a sensor 804, as discussed in greater detail below.

FIG. 8B illustrates a proposed sensor 825 in accordance with some embodiments of the present disclosure. Circuit 825 works at an exceptional point of degeneracy consisting of a time-varying LC resonator in parallel to a biosensing capacitor (its capacitance is function of the concentration of the material under test (MUT)). The sensing capacitor is realized for example by using an interdigitated capacitor or a parallel plate capacitor. The EPD induced in this single linear-time-periodic (LTP)-LC resonator is responsible of the very high sensitivity. The circuit 825 may form a sensor, e.g., a biosensor or other types of sensor.

The circuit 825 may be a biosensor and may include an LC resonator where the capacitor is time-variant and is in parallel to the biosensing capacitor, e.g., the capacitor whose capacitance is function of the concentration of the material under test (MUT). The biosensing capacitor can be implemented using an interdigitated capacitor (IDC) as illustrated in FIG. 8. Other types of capacitor can also be used.

In this system, the change in the concentration of the MUT will change the capacitance of the IDC that can be measured through the shift in the resonance frequency of the system and this shift is boosted when the system operates at an EPD. Two different biosensing scenarios based on the IDC in FIG. 8B (i) have been studied. A uniformly dissolved MUT in the background material above the IDC, and (ii) a thin layer of MUT placed on top of the electrodes. But many other scenarios could be also implemented with the proposed sensing circuit.

The following first show the behavior of a linear time periodic (LTP) LC resonator through the dispersion relation of the resonance frequency versus modulation and discuss the occurrence of EPDs in such a system. The analysis accounts for losses in the system. Section III a design and investigation of the performance of an IDC which is integrated in the system as the biosensing capacitor is discussed. The effect of the concentration of the MUT on the capacitance and the conductance of such capacitor for two cases of uniformly dissolved MUT and effective MUT layer may be shown. Section IV discussed the sensitivity of the designed system to perturbation, e.g., the concentration of the MUT may be characterized, and the proposed biosensor performance across different designs and frequencies may also be characterized. Moreover, to show the advantages and the superiority of the proposed EPD biosensor, its sensitivity with that of conventional biosensors may be compared.

IX. Enhancing the Sensitivity of Biosensors in an LTP System with EPDs

FIG. 8C illustrates a proposed LTP-LC resonator sensing circuit 850 in accordance with some embodiments of the present disclosure that illustrates that the sensing admittance Ysens can be composed of a sensing capacitor and a sensing conductance, as an example. This section demonstrates how to boost the sensitivity of conventional biosensors using an LTP-LC resonator as illustrated in FIG. 8C where the time-periodic variation is introduced in the system through the time-varying capacitor, $C_{ltv}(t)$. Although a time-varying capacitor is used to introduce a periodic variation, another type of time-varying component can be used. FIG. 8C illustrates a proposed LTP-LC resonator sensing circuit 850 in accordance with some embodiments of the present disclosure. Circuit 850 includes an inductor $L_0$ in series with a resistance R, in parallel to a time-varying capacitor $C_{ltv}$ whose capacitance is given by a two-level piece-wise constant time-periodic function as shown in the subset, with modulation frequency $f_m$. The LTP-LC tank also includes a parallel biosensor capacitor $C_{sens}$ and associated conductance $G_{sens}$. The values of both $C_{sens}$ and $G_{sens}$ are function of the concentration of the MUT.

FIG. 8B illustrates a circuit 825 that may function as a proposed sensor 804 in accordance with some embodiments of the present disclosure. FIG. 8C illustrates a proposed LTP-LC resonator sensing circuit 850 in accordance with some embodiments of the present disclosure.

This diagram is relative to the circuit in FIG. 8C. The curve 905 and curves 910 show the real and imaginary parts of the resonance frequency, respectively. The dispersion diagram may account for small losses in the circuit.

Figure 8D:
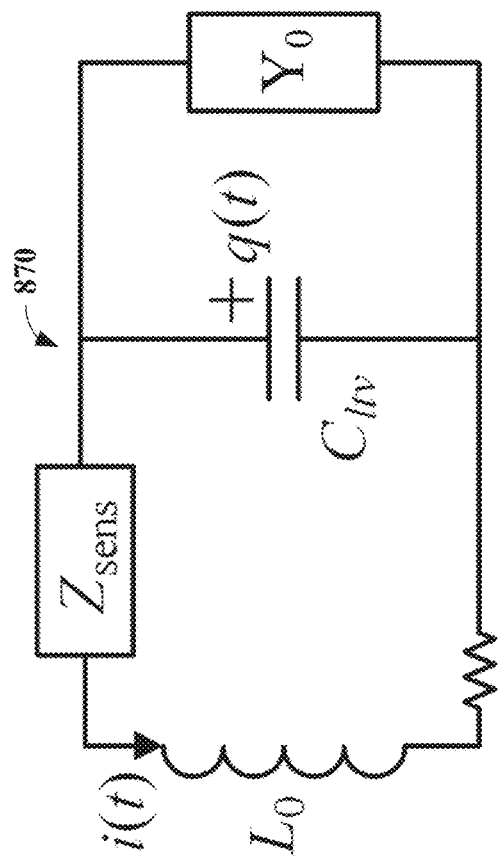
FIG. 8D is a diagram illustrating an example sensor configuration in accordance with some embodiments of the present disclosure.

FIG. 8D is a diagram illustrating an example sensor 870 configuration in accordance with some embodiments of the present disclosure. Here, as an example, the sensing part may be an impedance in series with the inductance. In the example of FIG. 8D the capacitor, $C_{ltv}$, may be variable. The inductor, $L_0$, may be a fixed inductance. In the example of FIG. 8D, a sensor, $Z_{sens}$, may be between the inductor, $L_0$ and the capacitor, $C_{ltv}$ rather than in parallel (as in FIGS. 8B-8C) with the inductor, $L_0$ and the capacitor, $C_{ltv}$. The resistance of the circuit is modeled as resistor, R.

Figure 8E:
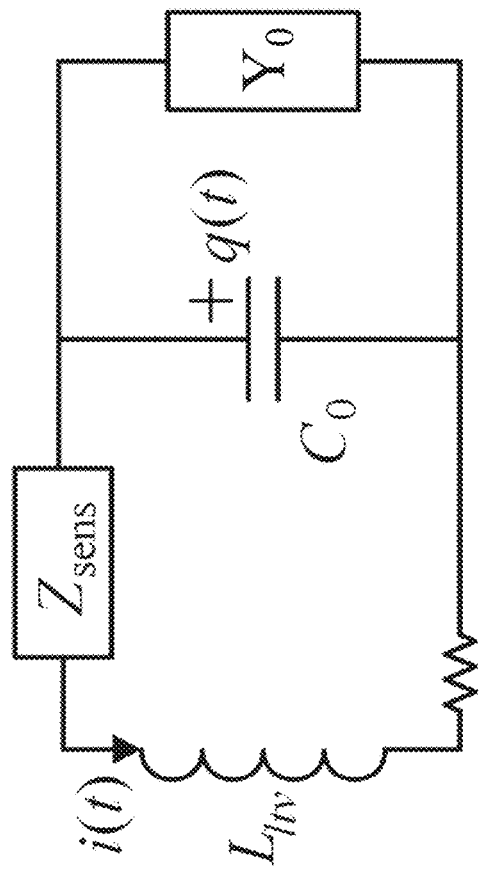
FIG. 8E is another diagram illustrating another example sensor configuration in accordance with some embodiments of the present disclosure.

FIG. 8E is another diagram illustrating another example sensor 880 configuration in accordance with some embodiments of the present disclosure. Here, the inductance is the LTV (i.e., LTP) element. In the example of FIG. 8E the inductor $L_{ltv}$, may be time varying. The capacitor, $C_0$, may be a fixed capacitance. In the example of FIG. 8E, a sensor, $Z_{sens}$, may be between the capacitor, $C_0$ and the inductor, $L_{ltv}$ rather than in parallel (as in FIGS. 8B-8C) with the capacitor, $C_0$ and the inductor, $L_{ltv}$.

The two-dimensional state vector $\Psi(t)=[q(t), i(t)]^T$ describes this system, where T denotes the transpose operator, q(t) and i(t) are the capacitor charge on both the capacitors in FIG. 9(a) and inductor current, respectively.

Figure 9:
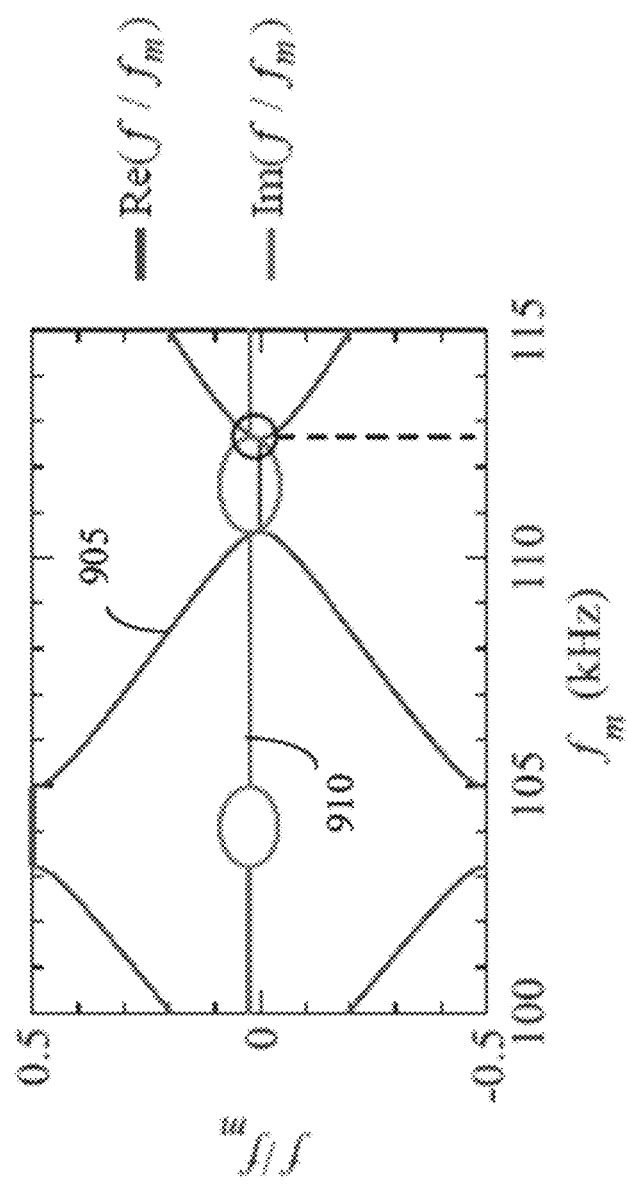
FIG. 9 illustrates the dispersion of these LIT-LC resonant frequencies (real and imaginary parts) versus modulation frequency $f_m$.

The temporal evolution of the state vector obeys the two-dimensional first-order differential equation (eqn. 19 below)

$$\frac{d}{dt}\Psi(t) = \underline{M}(t)\Psi(t) \tag{19}$$

where M(t) is the 2×2 time-varying system matrix. Assuming that the time-variation of the capacitance is a two-level piecewise constant, periodic, function as illustrated in the subset of FIG. 8C, the time-variant system matrix reads (eqn. 20 below)

$$\underline{M}_p = \begin{bmatrix} -G_{sens}/(C_p + C_{sens}) & -1 \\ 1/(L_0(C_p + C_{sens})) & -R/L_0 \end{bmatrix} \tag{20}$$

where $C_p$, with p=1, 2, represents the two values of the piece-wise constant time-varying capacitance $C_{ltv}(t)$ and $C_{sens}$ is the capacitance of the biosensing capacitor. The linear time-varying capacitance $C_{ltv}(t)$ is $C_{ltv}=C_1$ for $0<t\le 0.5T_m$ and $C_{ltv}=C_2$ for $0.5T_m<t\le T_m$. Losses in the system are represented by the series resistance of the inductor R and the parallel conductance $G_{sens}$ of the biosensing capacitor. The conductance $G_{sens}$ represents losses in the background medium and in the MUT. Considering that the LIT sensor is periodic with period $T_m=1/f_m$, the state vector from the time instant t to $t+T_m$ as $\Psi(t+T_m)=\underline{\Phi}(t, t+T_m)\Psi(t)$ may be translated through the 2×2 state transition matrix $\underline{\Phi}(t, t+T_m)$. In addition, the state vector satisfies $\Psi(t+T_m)=e^{j\omega T_m}\Psi(t)$ in a periodic systems, hence the eigenvalue problem may be constituted as (eqn. 21 below)

$$(\underline{\Phi}(t,t+T_m)-e^{j\omega T_m}\underline{I}(t))\Psi=0, \tag{21}$$

where I is the 2×2 identity matrix. Considering the eigenvalue problem derived in (21), the eigenvalues $e^{j\omega T_m}$ of the state transition matrix $\Phi(t, t+T_m)$ may be found, hence the circuit eigen-frequencies $f=\omega/(2\pi)$ that are the resonance frequencies of the circuit. FIG. 9 illustrates the dispersion of these LTP-LC resonant frequencies versus modulation frequency $f_m$.

The small asymmetry of the real and imaginary parts of the resonance frequencies f with respect to the center f=0 Hz is due to the small losses in the circuit components. Such a dispersion diagram is obtained for the circuit parameters set as $L_0=15$ μH, R=0.1Ω, $C_1=4.5$ nF, $C_2=1.5$ nF. The parameters of the biosensing capacitor are derived based on the first order model described in Section III and set as $C_{sens}=0.3$ nF and $G_{sens}=67$ μS. It is observed from FIG. 9B that the time-periodic LC resonator exhibits second order EPDs (the band edges of each band gap) for selected modulation frequencies, e.g., when two resonance frequencies coalesce at a specific modulation frequency $f_m$. Note that the LC resonator is time-periodic, therefore for a resonance frequency f there exist all the correspondent Fourier harmonics $f+nf_m$, where n=1, 2.

The EPDs occur either at the center or at edge of the Brillouin zone (BZ) (we use this term in analogy to what happens in periodic electromagnetic waveguides) as it can be inferred from FIG. 9B. For instance, one of the EPDs in FIG. 9B is indicated with a black circle: at the modulation frequency $f_m=112.6$ kHz the LTP-LC resonance frequencies are $f_e=f_{e0}+nf_m$. The one in the black circle corresponds to the n=0 harmonic $f_{e0}=j2.6$ kHz, and the small imaginary part is due to losses in the circuit. The resonance frequencies of such a system operating at an EPD are highly sensitive to perturbation of any system parameter. In general, a perturbation δ of a system parameter leads to a perturbed transition matrix $\underline{\Phi}(\delta)$ that in turn generates two perturbed resonant frequencies $f_p(\delta)$ with p=1, 2, slightly away from the degenerate resonance frequency $f_e$ of the system operating at the second order EPD. It has been demonstrated that the perturbation of the eigenvalues of (3), hence the perturbation of the resonant frequencies, cannot be represented with a Taylor expansion of the degenerate resonant frequency around $f_e$. The first order approximation of $f_p(\delta)$ near the EPD is derived by a Puiseux series (also called "fractional power expansion") using the explicit recursive formulas given in as (eqn. 22 below)

$$f_p(\delta) \approx f_e \pm j\frac{f_m}{2\pi}(-1)^p \alpha_1 \sqrt{\delta} \qquad (22)$$

$$\text{Where } \alpha_1 = \sqrt{-\frac{d}{d\delta}\left[\det(\underline{\Phi}(\delta) - e^{j2\pi fT_m L})\right]}\Big|_{\delta=0, f=f_e}$$

and the ± signs correspond to EPDs at the center or edge of the BZ. Equation (22) indicates that for a small perturbation δ<<1, the resonance frequencies $f_p$ change dramatically from their original degenerate frequency $f_e$ due to the square root function. As an example, a perturbation δ=0.0001 generates a resonance frequency shift $f_p(\delta)-f_e$ proportional to δ=0.01, that is much larger than that in standard LC resonators, where such shift would be simply proportional to δ.

X. Characterization of the Biosensor Performance

We characterize the sensitivity of the biosensor system operating at an EPD, based on a LTP-LC resonator made of the parallel arrangement of the biosensing capacitor in section III and a time-varying capacitor.

A. Sensitivity Comparison with Conventional Biosensors.

We start by showing a comparison between the sensitivity of a biosensor based on a LTP-LC resonator operating near an EPD and a conventional biosensor based on a linear time-invariant (LTI)-LC resonator, e.g., a standard LC resonator. The values of the LTP-LC resonator are the same as those in the previous sections. To assess a fair comparison, the capacitance in the LTI-LC resonator may be assumed to be equal to the time average capacitance in the LTP-LC resonator, e.g., $C_0=(C_1+C_2)/2$, and all the other parameters are the same as those of the LTP-LC case in Section II, e.g., $L_0$=15 µH, R=0.1Ω, $C_{sens}$=0.3 nF and $G_{sens}$=67 µS.

Figure 11:
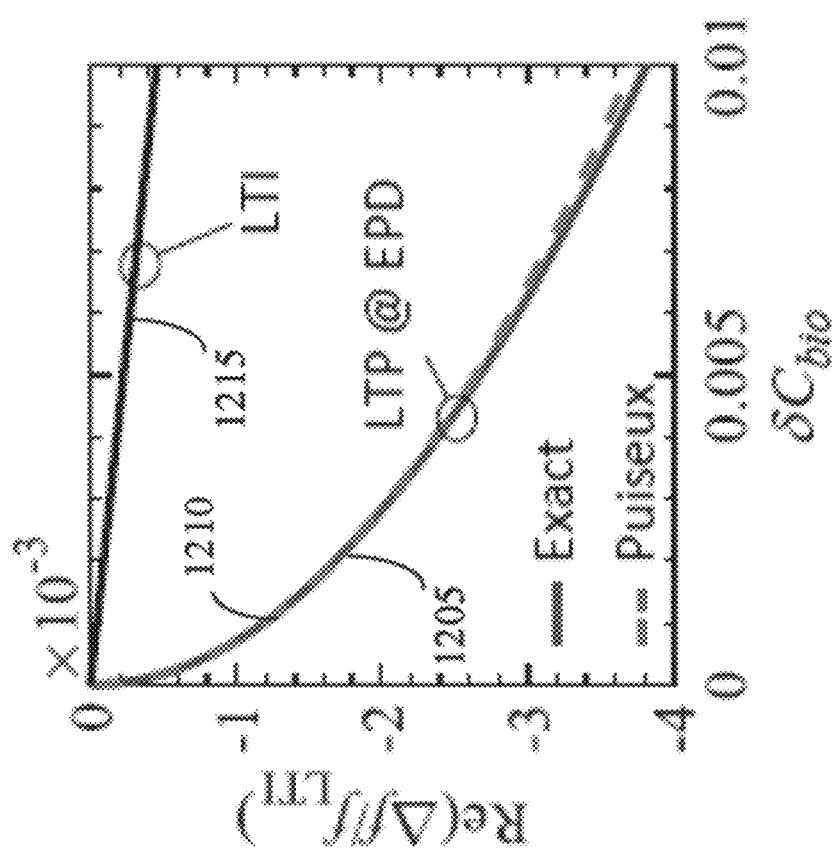
FIG. 11 illustrates the relative change in resonance frequency (only the one moving towards lower frequencies is shown) of a biosensor as a function of the relative change in the biosensing capacitance $C_{sens}$. The frequency shift of the LTP system working at an EPD is much larger than the one obtained with a LTI resonating system.

FIG. 11 illustrates the relative change in resonance frequency (only the one moving towards lower frequencies is shown) of a biosensor as a function of the relative change in the biosensing capacitance $C_{sens}$. The frequency shift of the LTP system working at an EPD may be much larger than the one obtained with a LTI resonating system. The solid curve 1205 and dashed curve 1210 illustrate the resonance frequency shift of the LTP-LC biosensor with EPD, whereas the black curve 1215 shows the resonance shift in a conventional LTILC resonator, respectively. The comparison clearly shows the much higher sensitivity of the sensor based on the EPD in the LTP-LC resonator.

Figure 12:
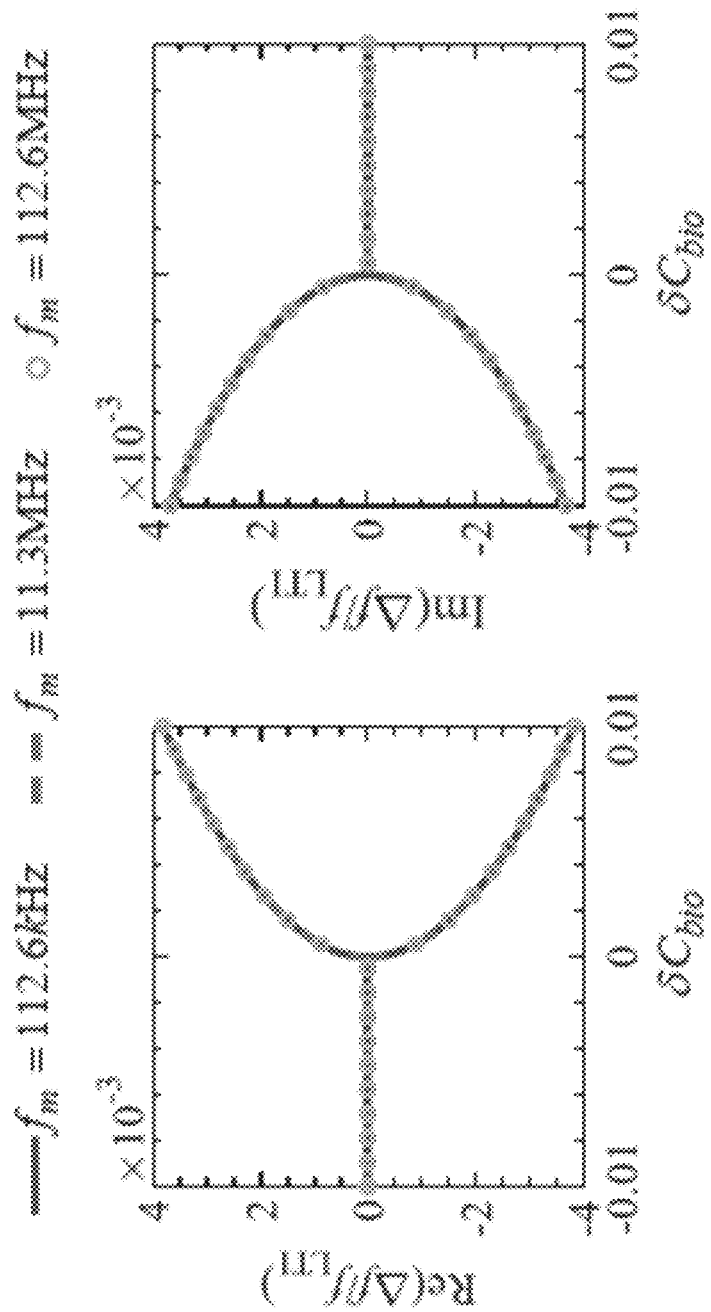
FIG. 12 illustrates the change in the real part of a resonance frequency $\Delta f = f_p(\delta) - f_p(0)$, with p=1, 2, versus relative perturbation $\delta C_{sens}$, for both the LTI (standard case) and LTP (EPD case) biosensors.

FIG. 12 also illustrates the change in the real part of a resonance frequency $\Delta f=f_p(\delta)-f_p(0)$ versus relative perturbation $\delta C_{sens}$, for both the LTI (standard case) and LIT (EPD case) biosensors. Therefore, for the LTP-LC biosensor, Δf describes the shift of the resonance frequency $f_p(\delta)$ in the perturbed biosensor with respect to the 6th harmonics (n=6) of the degenerate resonance frequency, e.g., $f_p(0)=f_{e0}+6f_m$= (675.8+j2.6) kHz of the unperturbed biosensor (e.g., working at an EPD). Similarly, Δf for the LTI-LC case shows p shift of the resonance frequency with respect to unperturbed resonance frequency $f_p(0)$=(715.4+j2.2) kHz. The change $\delta C_{sens}$ in the biosensing capacitance is due to the change in the MUT concentration δ in the background material, illustrated in FIGS. 10A and 10B for the two biosensing scenarios.

Figures 10A, 10B:
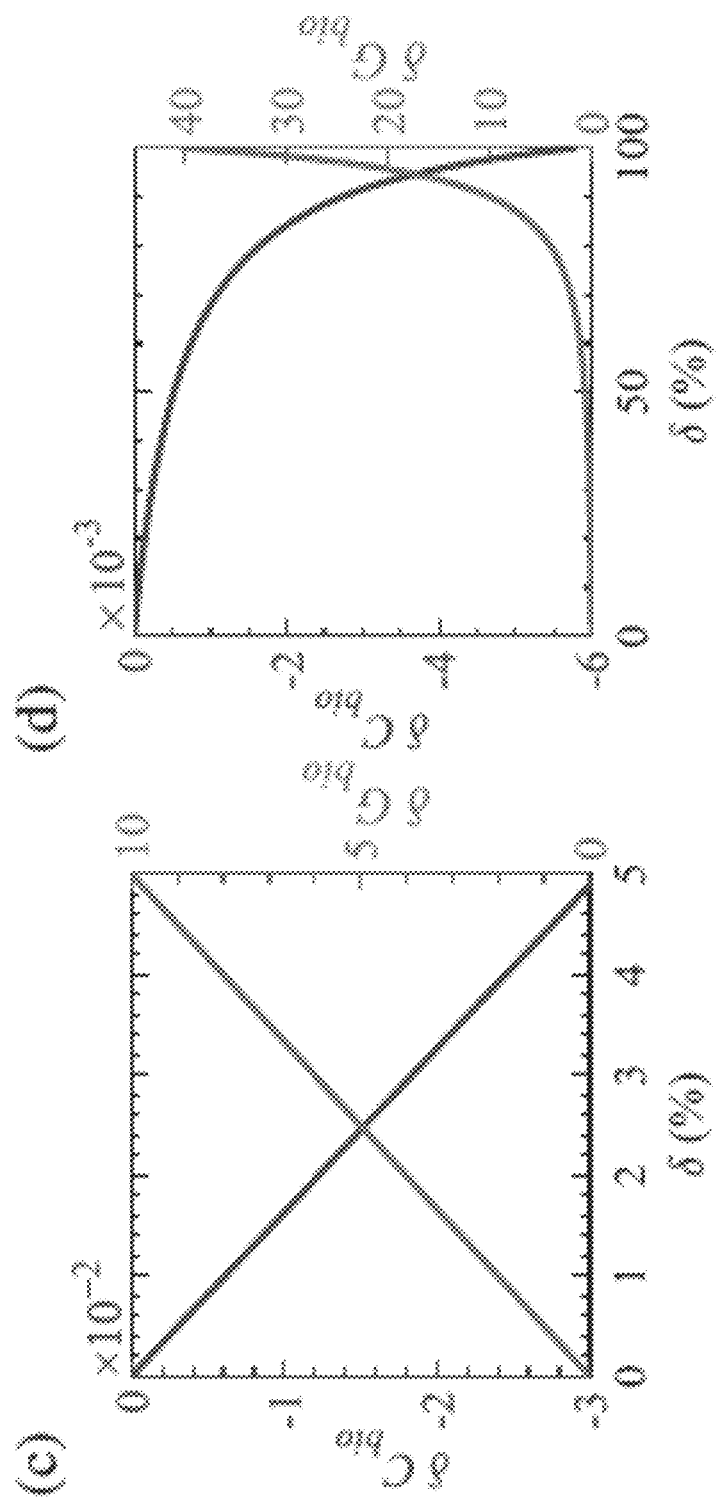
FIGS. 10A and 10B illustrate the change in a biosensing capacitance $\delta C_{sens}$ due to the change in the material under test (MUT) concentration $\delta$ in the background material, for the two biosensing scenarios.

FIGS. 10A and 10B illustrate the change in a biosensing capacitance $\delta C_{sens}$ due to the change in the material under test (MUT) concentration δ in the background material inside the capacitor, for the two biosensing scenarios. In some examples, a relation between the sensed material change and change in the capacitance value may cause a large frequency shift in the LTV-EPD resonator.

The change of the resonance frequency $\Delta f=f_p(\delta) (f_{e0}+6f_m)$ based on the EPD perturbation is well described by the Puiseux series in (4), truncated to the first order. Indeed, this approximation is in very good agreement with the "exact" result for the LIT case obtained by solving Eq. (22), showing the analytical nature of the ultra-sensitivity concept of the EPD-based sensor. In FIG. 12 the perturbation of the resonance frequency for both the LIT-LC and LTI-LC resonators have been normalized to the resonance frequency of the lossless unperturbed LTI-LC resonator that is calculated as $f_{LTI}=1/(2\pi \sqrt{L_0(C_0+C_{sens})})$=715.4 kHz.

FIG. 11 also shows the highly remarkable sensitivity associated with the biosensor designed to operate at an EPD of the LTP-LC system. Such ultra-sensitivity of the LTP-LC resonator operating at a second order EPD was observed experimentally in general terms, hence here the sensitivity to the variation of a MUT in a biosensing scenario may be investigated. One may note that the value of $\alpha_1$ in Eq. (4) can significantly affect the sensitivity of the LTP-LC resonator and it is determined by the parameters of the system. Considering the values used in this paper, $\alpha_1=-j2.6$. Moreover, it can be inferred from the fractional power expansion of the resonance frequencies in Eq.(22) that for an imaginary value of $\alpha_1$, a perturbation δ>0 implies that only the real part of the resonance frequency changes while the imaginary part is constant (e.g. there are two purely real frequencies), whereas a perturbation δ<0 implies that the imaginary part is the one changing while the real part remains constant. Future work shall focus on how to maximize this value based on the design of the circuit parameters.

Figure 13:
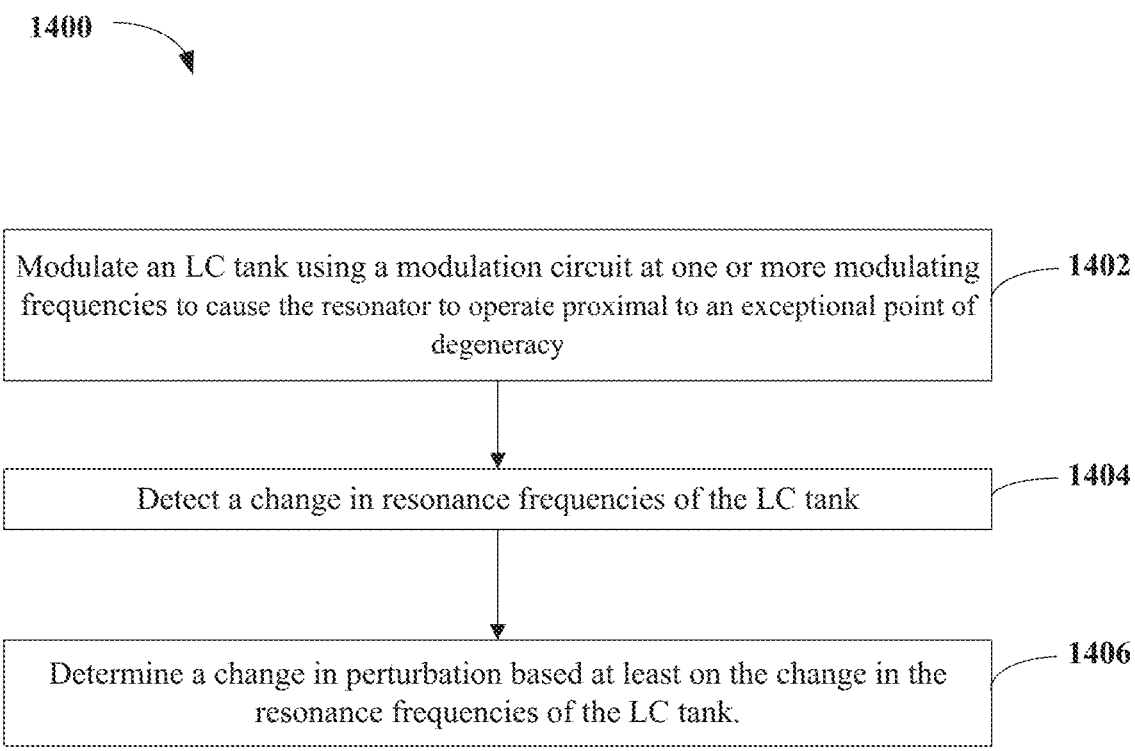
FIG. 13 is a flow diagram illustrating an example method in accordance with the systems and methods described herein.

FIG. 13 illustrates the scalability of the proposed ultra-sensitivity concept over a large range of frequencies. It illustrates the resonance frequency shift Δf ($\delta C_{sens}$), normalized to modulation frequency, exhibiting large variations even for very small relative perturbations $C_{sens}$, for three different designs with three different modulation frequencies. In each case the LTP-LC resonator works at an EPD. The solid-blue curve shows a design with modulation frequency $f_m$=112.6 kHz, the dashed curve and circles represent scaled designs of the biosensor with modulation frequencies $f_m$=11.3 MHz and $f_m$=112.6 MHz, respectively.

B. Sensing Scalability Across Different Frequencies

As mentioned in the introduction, a system operating at an EPD exhibits an enormous sensitivity to any perturbation to the system. In such a system, illustrated in FIG. 2, different EPD resonances for different modulation frequencies may be used, hence a sensor with exceptional sensitivity may be designed to operate at any of the different modulation frequencies. To illustrate the exotic performance of the described sensing system, assume that the biosensing capacitor is experiencing a δ increase in the concentration of the MUT, hence the biosensing capacitance value may be perturbed as $C_{sens}(\delta)$, and the biosensing capacitor's relative change $\delta C_{sens}$ follows the behavior illustrated in FIGS. 10A and 10B, for the two sensing scenarios illustrated in FIGS. 10A and 10B. FIG. 10A, represents the scenario where the MUT is uniformly dissolved in the background material, and FIG. 10B, represents the scenario where an effective layer made of the MUT is immersed in the background material.

In turn, a relative positive increment $\delta C_{sens}$ perturbs the LTP-LC resonator operating at an EPD, generating two real resonance frequencies, whereas a negative $\delta C_{sens}$, generates two resonance frequencies that deviate in their imaginary part, following the dispersion diagram in FIG. 9B. These features are better illustrated in FIG. 6 that illustrates such ultra-sensitivity of the resonance frequency to small values of $\delta C_{sens}$, considering three case with three different modulation frequencies $f_m$. FIGS. 6A and 6B illustrate the real and imaginary shifts of the resonance frequencies, respectively, where the solid-blue curve represents a design with a modulation frequency $f_m$=112.6 kHz, the dashed curve and circles represent a scaled designs of the biosensor with modulation frequencies $f_m$=11.3 MHz and $f_m$=112.6 MHz, respectively.

It is concluded from the figure that the real and imaginary parts of the resonance frequency are sharply sensitive to the external perturbation (e.g., the concentration of the MUT). It may be concluded that this sensitivity property is valid (it may actually be the same) regardless of the chosen modulation frequency which indicates a freedom in the choice of the circuit components, and that the concepts presented in this paper are scalable to any operating frequency.

The concept of EPDs induced in linear time-periodic systems may be exploited to achieve extremely sensitive biosensors based on the detection of a resonant frequency shift. A single time-varying LC resonator may be used having a capacitance given by the parallel arrangement of a time-variant capacitor and the biosensing capacitor. Furthermore, a model of interdigitated capacitors has been developed that may have changes of capacitance due to the variations in the concentration of an MUT and investigated how sensitive is the LTP-LC biosensor to such changes. Two different sensing scenarios have been considered and an unprecedented sensitivity to the perturbations of the time-variant LC resonator at an EPD is illustrated. The sensitivity of the resonance frequency in a single, time-varying, LC resonator working at an EPD to perturbations has been demonstrated to be much higher than that of a single, time-invariant (e.g., standard), LC resonator. The practical implementation of this sensing technology seems straightforward since the time-modulated capacitance can be realized with a simple multiplier controlled by a modulated voltage pump for example. The working principle for the proposed ultra-sensitive biosensor is general and can be easily implemented in existing systems to enhance sensitivity, paving the way to a new class of ultra-sensitive sensors.

FIG. 14 is a flow diagram illustrating an example method in accordance with the systems and methods described herein. The method 1400 may be a method for detecting small perturbation. In the illustrated example, the method 1400 includes modulating an LC tank using a modulation circuit at one or more modulating frequencies to cause the LC tank to operate in and exceptional point of degeneracy state (1402). The method 1400 may also include detecting a change in resonance frequencies of the LC tank (1404). Additionally, the method 1400 may include determining a change in perturbation based at least on the change in the resonance frequencies of the LC tank (1406). Modulating an LC tank using a modulation circuit at one or more modulating frequencies to cause the LC tank to operate in and exceptional point of degeneracy state (1402) may include providing the LC tank circuit and applying a signal to the LC tank circuit. Detecting a change in resonance frequencies of the LC tank (1404) may include monitoring a signal for the change and measuring a change in the signal being monitored. Determining a change in perturbation based at least on the change in the resonance frequencies of the LC tank (1406) may include triggering on the change detected and mapping the change to a corresponding estimate for the change in perturbation.

CONCLUSION

One or more of the components, processes, features, and/or functions illustrated in the figures may be rearranged and/or combined into a single component, block, feature or function or embodied in several components, steps, or functions. Additional elements, components, processes, and/or functions may also be added without departing from the disclosure. The apparatus, devices, and/or components illustrated in the Figures may be configured to perform one or more of the methods, features, or processes described in the Figures. The algorithms described herein may also be efficiently implemented in software and/or embedded in hardware.

Note that the aspects of the present disclosure may be described herein as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and processes have been described above generally in terms of their functionality. Whether such functionality is implemented as hardware or software depends upon the particular application and design constraints imposed on the overall system.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The embodiments described above are considered novel over the prior art and are considered essential to the operation of at least one aspect of the disclosure and to the achievement of the above-described objectives. The words used in this specification to describe the instant embodiments are to be understood not only in the sense of their commonly defined meanings, but to include by special definition in this specification: structure, material or acts beyond the scope of the commonly defined meanings. Thus, if an element can be understood in the context of this specification as including more than one meaning, then its use must be understood as being generic to all possible meanings supported by the specification and by the word or words describing the element.

The definitions of the words or drawing elements described above are meant to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

In the foregoing description and in the figures, like elements are identified with like reference numerals. The use of "e.g.," "etc," and "or" indicates non-exclusive alternatives without limitation, unless otherwise noted. The use of "including" or "includes" means "including, but not limited to," or "includes, but not limited to," unless otherwise noted.

As used above, the term "and/or" placed between a first entity and a second entity means one of (1) the first entity, (2) the second entity, and (3) the first entity and the second entity. Multiple entities listed with "and/or" should be construed in the same manner, e.g., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" can refer, in one embodiment, to A only (optionally including entities other than B); in another embodiment, to B only (optionally including entities other than A); in yet another embodiment, to both A and B (optionally including other entities). These entities may refer to elements, actions, structures, processes, operations, values, and the like.

The invention claimed is:

1. A circuit comprising:
a reset circuit;
a modulation circuit;
an LC circuit, the modulation circuit and the LC circuit forming a combined modulation circuit and LC circuit; and
the modulation circuit configured to modulate an effective inductance or capacitance when connected to the LC circuit creating a modulated LC circuit to cause the combined modulation circuit and the LC circuit to operate proximal to an exceptional point of degeneracy (EPD), the modulation circuit including a multiplier circuit configured to receive a modulating periodic signal, and the reset circuit coupled to the multiplier and the LC circuit, the reset circuit configured to reset the modulation circuit.

2. The circuit of claim 1, wherein the modulation circuit comprises a time-varying voltage source configured to modulate the effective capacitance or inductance of the combined modulation circuit and LC circuit at a first frequency of the modulation.

3. The circuit of claim 2, wherein the modulation circuit is configured to modulate an effective capacitance of the combined modulation circuit and the LC circuit.

4. The circuit of claim 3, wherein the modulation circuit is configured to modulate the capacitance of the combined modulation circuit and the LC circuit periodically between two or more capacitance levels or even in periodic continuous fashion.

5. The circuit of claim 4, wherein the two or more capacitance levels comprise a low and a high voltage level.

6. The circuit of claim 1, wherein the LC circuit comprises at least one of a variable capacitor and a variable inductor.

7. The circuit of claim 2, wherein the modulation circuit is configured to modulate an effective inductance value of the combined modulation circuit and LC circuit.

8. The circuit of claim 2, wherein the time-varying voltage source comprises a voltage pump to drive the multiplier, wherein the voltage pump is configured to modulate the multiplier.

9. The circuit of claim 8, wherein the circuit comprises a reset circuit configured to reset the modulated LC circuit prior to excessive signal growth in a combined circuit of the modulated LC circuit, the modulation circuit, and the voltage pump.

10. A circuit comprising:
a modulation circuit;
a reset circuit;
an LC tank, the reset circuit coupled to the LC tank;
a voltage multiplier, having an input, the voltage multiplier coupled to a capacitor of the LC tank; and
a time-varying voltage source coupled to the input of the voltage multiplier,
wherein the voltage multiplier, the reset circuit, and a capacitor C of the LC tank are in series, the series combination of the voltage multiplier, the reset circuit, and the capacitor in parallel with an inductor L of the LC tank, the voltage multiplier configured to receive a periodic modulating signal and the reset circuit coupled to the voltage multiplier and the LC tank based on a periodic reset signal, the modulation circuit configured to modulate an effective inductance or capacitance when connected to the LC tank creating a modulated LC tank.

11. The circuit of claim 10, wherein the time-varying voltage source is configured to modulate the voltage multiplier and capacitance of the LC tank such that the modulated LC tank operates substantially proximal to an exceptional point of degeneracy state.

12. The circuit of claim 10, wherein the voltage multiplier comprises a four-quadrant voltage multiplier.

13. The circuit of claim 10, wherein the reset circuit is configured to periodically reset the modulated LC tank to prevent saturation.

14. A method for detecting small perturbation, the method comprising:

modulating an effective inductance or capacitance of an LC tank, creating a modulated LC circuit using a modulation circuit at one or more modulating frequencies to cause the modulated LC tank to operate proximal to an exceptional point of degeneracy (EPD), the modulated LC tank comprising a voltage multiplier and a reset circuit, the voltage multiplier circuit configured to receive a modulation signal and reset circuit coupled to the voltage multiplier and the LC circuit based on a periodic reset signal;

detecting a change in resonance frequencies of the modulated LC tank; and determining a change in perturbation of a capacitor or an inductor of the modulated LC tank based at least on the change in the resonance frequencies of the modulated LC tank.

15. The method of claim 14, wherein the modulation circuit comprises a time-varying voltage source, wherein an effective capacitance of the modulated LC tank is modulated with a multiplied voltage output.

16. The method of claim 14, wherein modulating the modulation circuit connected to the LC tank comprises modulating an effective inductance of the modulation circuit connected to the inductor of the LC tank.

17. The method of claim 14, wherein the modulation circuit is configured to modulate a capacitance of the modulation circuit connected to the LC tank between two or more capacitance levels or even in periodic continuous fashion.

18. The method of claim 14, wherein the change in the resonance frequencies of the modulated LC tank comprises a change in one or more capacitance levels of a capacitor of the LC tank, the change in the one or more capacitance levels of the capacitor comprise a low and a high voltage level.

19. The method of claim 14, wherein the modulation circuit comprises a time-varying voltage source.

20. The method of claim 14, wherein the modulation circuit is configured to modulate an effective inductance value of the modulation circuit connected to an inductor of the LC tank.

21. The method of claim 14, wherein at every cycle, after the reset signal is operated, a Fourier transform is applied to a signal from the modulated LC tank to detect the main frequency components.

* * * * *